United States Patent
Kim et al.

(10) Patent No.: US 10,497,427 B2
(45) Date of Patent: Dec. 3, 2019

(54) MEMORY DEVICE USING SENSE AMPLIFIERS AS BUFFER MEMORY WITH REDUCED ACCESS TIME AND METHOD OF CACHE OPERATION OF THE SAME

(71) Applicant: Samsung Electronics Co., Ltd., Suwon-si, Gyeonggi-do (KR)

(72) Inventors: Chankyung Kim, Hwaseong-si (KR); Sungchul Park, Seoul (KR); Soo-Ho Cha, Seoul (KR); Seongil O, Suwon-si (KR); Kwangchol Choe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/611,169

(22) Filed: Jun. 1, 2017

(65) Prior Publication Data

US 2017/0365327 A1    Dec. 21, 2017

(30) Foreign Application Priority Data

Jun. 17, 2016 (KR) .................. 10-2016-0075912

(51) Int. Cl.
| | |
|---|---|
| G11C 11/4091 | (2006.01) |
| G11C 11/408 | (2006.01) |
| G11C 5/02 | (2006.01) |
| G11C 5/04 | (2006.01) |
| G11C 11/4093 | (2006.01) |
| G11C 8/12 | (2006.01) |
| G11C 11/4097 | (2006.01) |

(52) U.S. Cl.
CPC .......... *G11C 11/4091* (2013.01); *G11C 5/025* (2013.01); *G11C 5/04* (2013.01); *G11C 11/4087* (2013.01); *G11C 11/4093* (2013.01); *G11C 8/12* (2013.01); *G11C 11/4097* (2013.01); *G11C 2207/107* (2013.01)

(58) Field of Classification Search
CPC .................................................. G11C 11/4091
See application file for complete search history.

(56) References Cited

U.S. PATENT DOCUMENTS

| | | | | |
|---|---|---|---|---|
| 5,835,436 A | * | 11/1998 | Ooishi | ............ G11C 7/10 365/230.03 |
| 5,970,003 A | * | 10/1999 | Miyatake | ............ G11C 17/16 365/200 |
| 6,381,671 B1 | * | 4/2002 | Ayukawa | ............ G06F 12/0215 711/100 |
| 7,308,526 B2 | | 12/2007 | Lakshmanamurthy et al. | |
| 7,764,551 B2 | | 7/2010 | Seo et al. | |

(Continued)

*Primary Examiner* — Mushfique Siddique
(74) *Attorney, Agent, or Firm* — Sughrue Mion, PLLC

(57) ABSTRACT

Memory devices may include a memory cell connected to a word line and a bit line, a first bit line sense amplifier connected to the memory cell through the bit line and configured to amplify a signal of the bit line, and a second bit line sense amplifier disposed adjacent to the first bit line sense amplifier and not connected to the bit line. The second bit line sense amplifier may be selected by an address received from a processor, and data may be stored in the second bit line sense amplifier or the data is output from the second bit line sense amplifier according to a command received from the processor. In some aspects described herein, the memory device may include a buffer memory that operates at high speed, thereby increasing performance of a memory module.

4 Claims, 22 Drawing Sheets

(56) References Cited

U.S. PATENT DOCUMENTS

| | | |
|---|---|---|
| 8,760,918 B2 | 6/2014 | Lee et al. |
| RE45,097 E | 8/2014 | Iyer et al. |
| 8,806,140 B1 | 8/2014 | Kraipak et al. |
| 8,977,806 B1 | 3/2015 | Rosenband et al. |
| 8,990,458 B2 | 3/2015 | Yano et al. |
| 9,016,552 B2 | 4/2015 | Sweere |
| 9,171,585 B2 | 10/2015 | Rajan et al. |
| 2001/0009519 A1* | 7/2001 | Fujisawa ............... G11C 5/025 365/51 |
| 2001/0026483 A1* | 10/2001 | Hasegawa ............... G11C 7/18 365/200 |
| 2001/0028593 A1* | 10/2001 | Sekiguchi ............... G11C 7/18 365/230.03 |
| 2002/0093864 A1* | 7/2002 | Ooishi ............... G11C 7/18 365/222 |
| 2005/0169061 A1 | 8/2005 | Sohn et al. |
| 2005/0204091 A1 | 9/2005 | Kilbuck et al. |
| 2008/0002488 A1* | 1/2008 | Hasegawa ............... G11C 7/18 365/200 |
| 2008/0123391 A1 | 5/2008 | Cho et al. |
| 2011/0007591 A1* | 1/2011 | Lee ............... G11C 7/1048 365/219 |
| 2011/0026290 A1* | 2/2011 | Noda ............... G11C 5/025 365/51 |
| 2011/0069573 A1* | 3/2011 | Sato ............... G11C 11/406 365/222 |
| 2012/0127814 A1* | 5/2012 | Riho ............... G11C 29/06 365/201 |
| 2012/0246380 A1 | 9/2012 | Akerib et al. |
| 2014/0047175 A1 | 2/2014 | Abali et al. |
| 2014/0201761 A1 | 7/2014 | Dalal et al. |
| 2014/0233336 A1* | 8/2014 | Shin ............... G11C 7/065 365/205 |
| 2015/0242352 A1* | 8/2015 | Jang ............... G06F 13/4273 710/310 |
| 2016/0041772 A1 | 2/2016 | Dahlen et al. |
| 2016/0240242 A1* | 8/2016 | Son ............... G11C 11/4094 |
| 2017/0186477 A1* | 6/2017 | Park ............... G11C 11/4091 |
| 2017/0315737 A1* | 11/2017 | Kajigaya ............... G06F 3/0616 |

* cited by examiner

MEMORY DEVICE USING SENSE AMPLIFIERS AS BUFFER MEMORY WITH REDUCED ACCESS TIME AND METHOD OF CACHE OPERATION OF THE SAME

CROSS-REFERENCE TO RELATED APPLICATION

This U.S. non-provisional patent application claims priority under 35 U.S.C. § 119 of Korean Patent Application No. 10-2016-0075912, filed on Jun. 17, 2016, the entire contents of which are hereby incorporated by reference.

BACKGROUND

1. Technical Field

The present disclosure relates to memory devices and memory modules, and more particularly, to a memory module that overcomes a difference between access times caused by including memories having different capacities.

2. Description of Related Art

A semiconductor memory device may be classified as either a volatile memory device or a nonvolatile memory device. A volatile memory device may have advantages, such as a high read speed and a high write speed, as compared with a nonvolatile memory device. An example of a memory device may be a dynamic random access memory (DRAM).

Memory devices are widely used in electronic devices such as mobile devices, computers, and so on. As manufacturing process technologies develop, capacity of memory devices is increasing. Due to rapid performance improvement and a rapid rise in the number of uses of electronic devices recently, ultra-capacitive memory devices and ultra-capacitive memory modules are increasingly desirable.

As implementing an ultra-capacitive memory module may necessitate the inclusion of a large number of memory devices, a price of the memory module may become prohibitively expensive. Thus, a memory module having a low cost characteristic and an ultra-capacitive characteristic, and memory devices for that memory module, is desirable.

SUMMARY

Example embodiments of the present disclosure provide a memory device. The memory device may include a memory cell connected to a word line and a bit line, a first bit line sense amplifier connected to the memory cell through the bit line and configured to amplify a signal of the bit line, and a second bit line sense amplifier disposed adjacent to the first bit line sense amplifier and not connected to the bit line. The second bit line sense amplifier may be selected by an address received from a processor, and data may be stored in the second bit line sense amplifier or the data may be output from the second bit line sense amplifier according to a command received from the processor. The memory device according to example embodiments of the present disclosure may include a buffer memory that operates at high speed, thereby increasing performance of a memory module.

Example embodiments of the present disclosure may provide a memory module. The memory module may include a first memory device and a second memory device having a different operation speed or different capacity from the first memory device. The first memory device may comprise a memory cell array including a plurality of memory cells, a first bit line sense amplifier circuit connected to the plurality of memory cells through a plurality of bit lines and configured to amplify a signal of the plurality of bit lines, a second bit line sense amplifier circuit disposed adjacent to the first bit line sense amplifier circuit and not connected to any of the plurality of bit lines, and a row decoder configured to select a plurality of word lines connected to the plurality of memory cells and a sub word line connected to the second bit line sense amplifier circuit.

Example embodiments of the present disclosure may provide a memory module. The memory module may have first and second ultra-capacitive memory devices, first and second memory devices configured to act as a cache for the first and second ultra-capacitive memory devices; first and second data buffers configured to transmit inputted data inputted to the first and second memory devices or to the first and second ultra-capacitive memory devices; and a register clock driver. The register clock driver may be configured to determine whether to drive the first and second ultra-capacitive memory devices or the first and second memory devices.

DETAILED DESCRIPTION

Below, embodiments of the present disclosure will be described more fully with reference to accompanying drawings to such an extent that one of an ordinary skill in the art may implement various aspects of the present disclosure.

Figure 1:
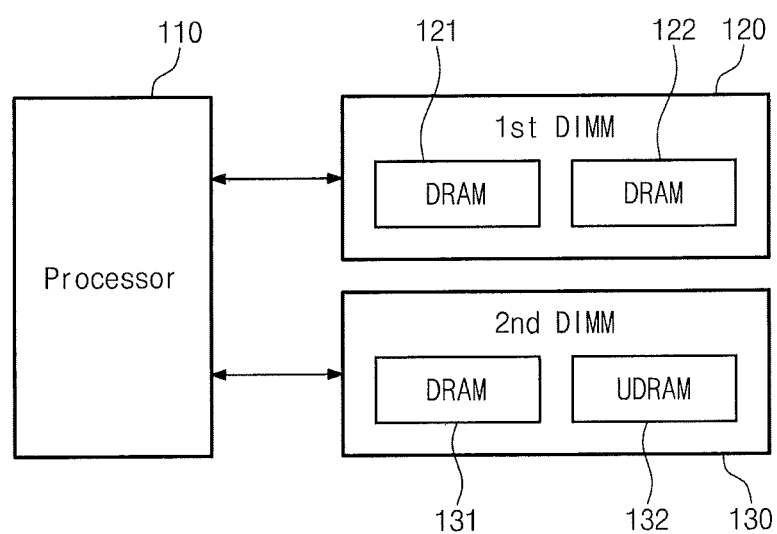
FIG. 1 is a view illustrating a computing system in accordance with example embodiments of the present disclosure.

FIG. 1 is a view illustrating a computing system in accordance with example embodiments of the present disclosure. Referring to FIG. 1, a computing system 100 may include a processor 110, a first memory module (DIMM) 120, and a second memory module (DIMM) 130.

The processor 110 may control an overall operation of the computing system 100. The processor 110 may process various data and perform various arithmetic operations being performed in the computing system 100. Although not illustrated in FIG. 1, the processor 110 may further include a memory management unit (MMU) to manage the first memory module 120 and the second memory module 130.

The first memory module 120 may be embodied by a dual in-line memory module. The first memory module 120 may include memory devices 121 and 122. The first memory module 120 may be used as a working memory of the processor 110.

The second memory module 130 may include a memory device (DRAM) 131 and an ultra-capacitive memory device (UDRAM) 132. The ultra-capacitive memory device 132 may provide ultra-high capacity, and in some aspects may provide ultra-high capacity with low cost. The memory device 131 may operate as a cache of the ultra-capacitive memory device 132. Thus, as compared with the first memory module 120, which may be a general memory module, the second memory module 130 may provide ultra-high capacity through the ultra-capacitive memory device 132. The second memory module 130 may operate at high speed through the memory device 131 that operates as a cache.

Figure 2:
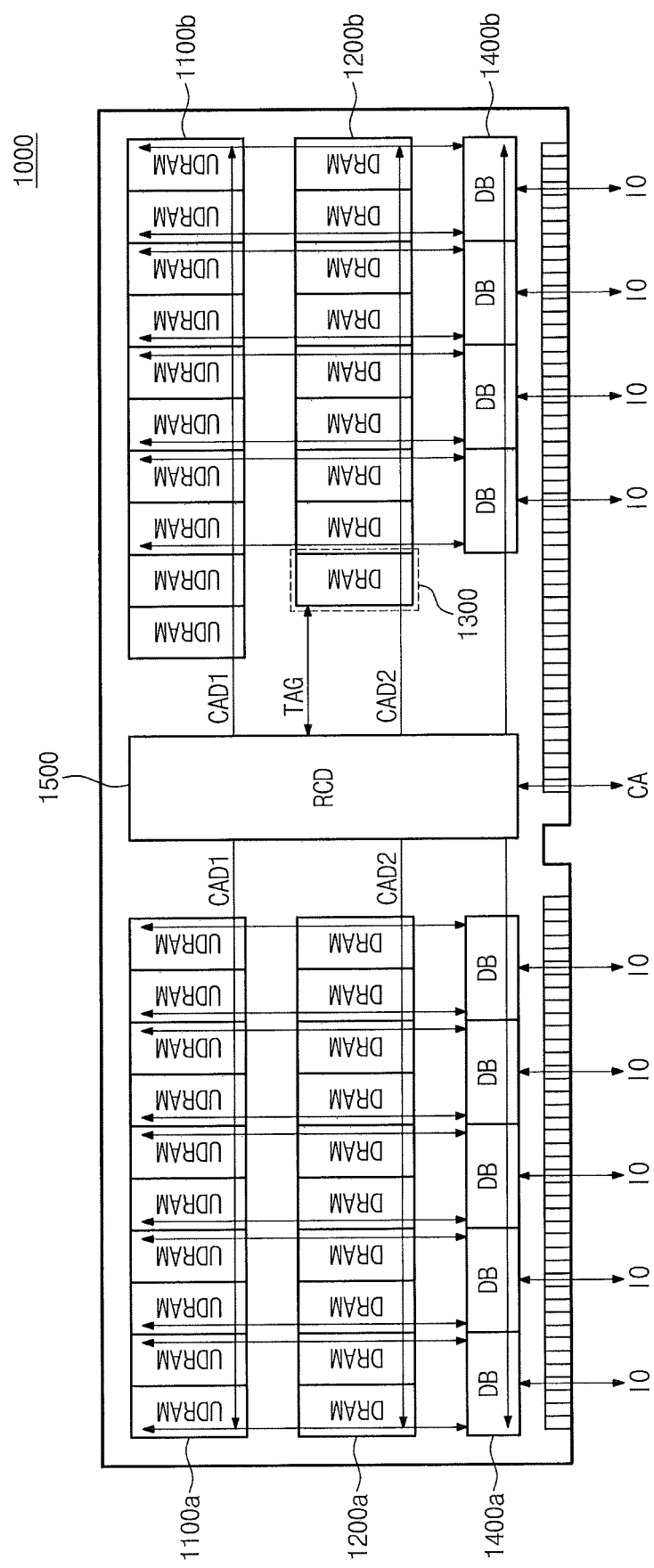
FIG. 2 is a block diagram illustrating a memory module in accordance with example embodiments of the present disclosure.

FIG. 2 is a block diagram illustrating a memory module in accordance with example embodiments of the present disclosure. A memory module 1000 depicted in FIG. 2 may correspond to the second memory module 130 depicted in FIG. 1. Referring to FIG. 2, the memory module 1000 may include first and second ultra-capacitive memory devices (UDRAMs) 1100a and 1100b, first, second and third memory devices (DRAMs) 1200a, 1200b, and 1300, first and second data buffers (DBs) 1400a and 1400b, and a register clock driver (RCD) 1500.

Referring to FIG. 2, in the memory module 1000, the first and second ultra-capacitive memory devices (UDRAMs) 1100a and 1100b are disposed respectively on the left and right sides with the register clock driver 1500 between them. In the memory module 1000, the first and second memory devices (DRAMs) 1200a and 1200b are disposed respectively on the left and right sides with the register clock driver 1500 between them. In the memory module 1000, the first and second data buffers (DBs) 1400a and 1400b are disposed respectively on the left and right sides with the register clock driver 1500 between them. It may be understood that this internal configuration arrangement does not limit the present disclosure.

An input/output operation (e.g., a write or read operation) may be performed with respect to the first and second ultra-capacitive memory devices (UDRAMs) 1100a and 1100b according to a first command and an address CAD1. Each of the first and second ultra-capacitive memory devices (UDRAMs) 1100a and 1100b may be embodied with ultra-high capacity as compared with a general memory device.

An input/output operation may be performed with respect to the first and second memory devices (DRAMs) 1200a and 1200b according to a second command and an address CAD2. The total capacity of the first and second memory devices (DRAMs) 1200a and 1200b may be smaller than the total capacity of the first and second ultra-capacitive memory devices (UDRAMs) 1100a and 1100b. Each of the first and second memory devices (DRAMs) 1200a and 1200b may operate at a higher speed as compared with the first and second ultra-capacitive memory devices (UDRAMs) 1100a and 1100b. Thus, each of the first and second memory devices (DRAMs) 1200a and 1200b may operate as a cache of each of the first and second ultra-capacitive memory devices (UDRAMs) 1100a and 1100b. A part (cache data) of data that is stored in each of the first and second ultra-capacitive memory devices (UDRAMs) 1100a and 1100b may be stored in each of the first and second memory devices (DRAMs) 1200a and 1200b. Thus, in the case where the processor 110 (refer to FIG. 1) accesses to the first and second memory devices (DRAMs) 1200a and 1200b before the first and second ultra-capacitive memory devices (UDRAMs) 1100a and 1100, a data transmission speed of the memory module 1000 may be improved.

The third memory device 1300 may include tag information of the first and second memory devices (DRAMs) 1200a and 1200b that operate as a cache. The tag information may include, for example, actual addresses of the first and second memory devices (DRAMs) 1200a and 1200b in which cache data is stored. For example, the register clock driver 1500 may store data frequently used by the processor 110 in the first and second memory devices (DRAMs) 1200a and 1200b that operate as a cache. The register clock driver 1500 may store address information (e.g., tag information) about frequently used data (cache data) in the third memory device 1300.

A processor, such as the processor 110 from FIG. 1, may input address information to the memory module 1000 to read data from the memory module 1000. This address information may include the tag information. In a case where a read operation is performed with respect to the memory module 1000, the third memory device 1300 may transmit the stored tag information to the register clock driver 1500 by a control of the register clock driver 1500.

In the case where the tag information inputted from the processor (e.g., the processor 110 of FIG. 1) coincides with the tag information stored in the third memory device 1300, read data may be output from the first and second memory devices (DRAMs) 1200a and 1200b that operate as a cache. In the case where the tag information inputted from the processor 110 does not coincide with the tag information stored in the third memory device 1300, read data may be output from the first and second ultra-capacitive memory devices (UDRAMs) 1100a and 1100b.

The first and second data buffers (DBs) 1400a and 1400b may be connected to the first and second memory devices (DRAMs) 1200a and 1200b and the first and second ultra-capacitive memory devices (UDRAMs) 1100a and 1100b. The first and second data buffers (DBs) 1400a and 1400b may transmit data (TO) inputted from the processor 110 (refer to FIG. 1) to the first and second memory devices (DRAMs) 1200a and 1200b or the first and second ultra-capacitive memory devices (UDRAMs) 1100a and 1100b. The first and second data buffers (DBs) 1400a and 1400b may transmit data from the first and second memory devices (DRAMs) 1200a and 1200b or the first and second ultra-capacitive memory devices (UDRAMs) 1100a and 1100b to the processor 110.

The register clock driver 1500 may control an overall operation of the memory module 1000. The register clock driver 1500 may receive a command and addresses (CA) from the processor 110. The register clock driver 1500 may generate a first command and an address (CAD1) that control the first and second ultra-capacitive memory devices (UDRAMs) 1100a and 1100b based on the received command and addresses (CA). The register clock driver 1500 may generate a second command and an address (CAD2) that control the first and second memory devices (DRAMs) 1200a and 1200b with reference to the received command and addresses (CA). The register clock driver 1500 may be provided with tag information from the third memory device 1300. The register clock driver 1500 may compare the tag information described above with tag information inputted from the processor 110. The register clock driver 1500 may determine whether to drive the first and second ultra-capacitive memory devices (UDRAMs) 1100a and 1100b or the first and second memory devices (DRAMs) 1200a and 1200b through a comparison result.

Figure 3:
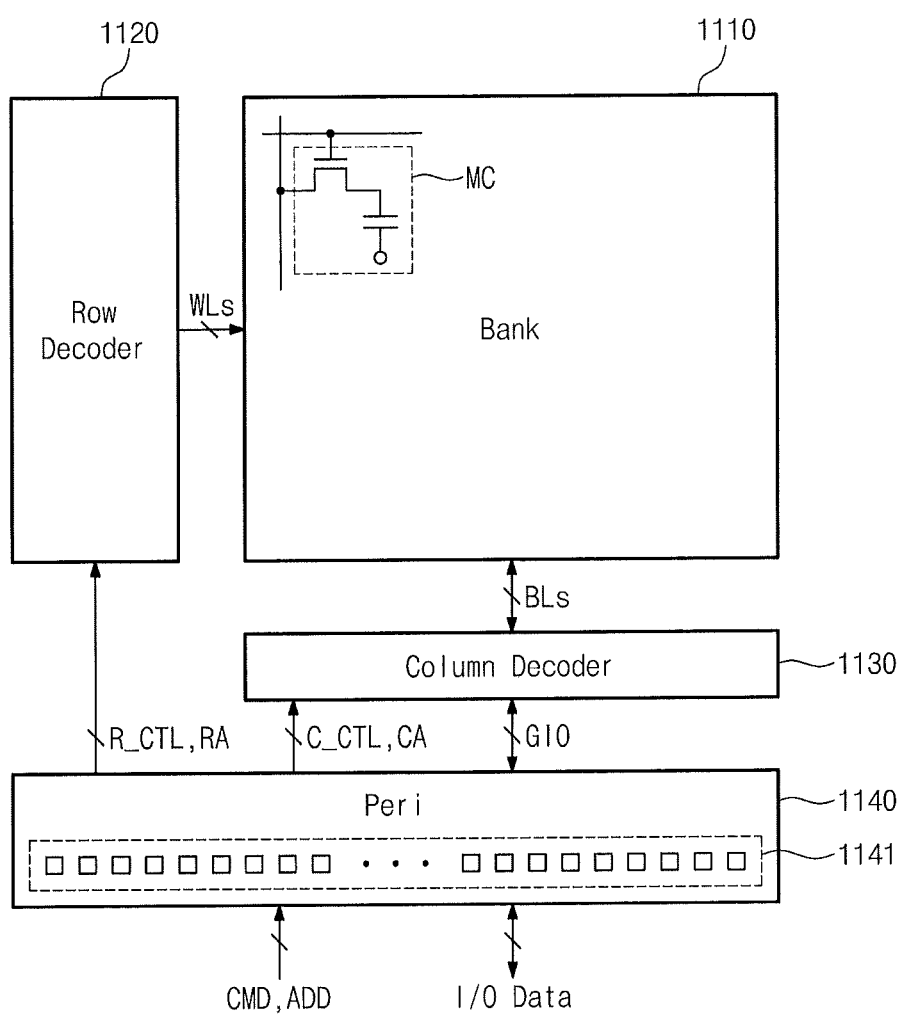
FIG. 3 is a block diagram illustrating an ultra-capacitive memory device in accordance with example embodiments of the present disclosure.

FIG. 3 is a block diagram illustrating an ultra-capacitive memory device in accordance with example embodiments of the present disclosure. Referring to FIG. 3, an ultra-capacitive memory device 1100 may include a bank 1110, a row decoder 1120, a column decoder 1130, and a peripheral circuit 1140.

The bank 1110 may include a plurality of word lines WLs and a plurality of bit lines BLs. The bank 1110 may include a memory cell MC at a region where a word line crosses a bit line. For example, the memory cell MC may be a DRAM cell including one transistor and one capacitor.

Referring to FIG. 3, the ultra-capacitive memory device 1100 may include a bank. The number of banks is not limited to that illustrated in FIG. 3. The number of banks may be determined by prearranged specification. As the number of banks increases, performance of the memory device may be improved. In the case where the memory device includes a plurality of banks, the processor 110 (refer to FIG. 1) may access other banks while accessing to any one bank. Thus, the memory device may include a plurality of banks so that the processor 110 can access to a plurality of banks concurrently.

The bank 1110 may be driven by the row decoder 1120 and the column decoder 1130. In the case where the memory device includes a plurality of banks, the memory device may include a number of row decoders and of column decoders that matches a number of the plurality of banks. Thus, a decreased number of banks 1110 may result in a reduced area of the memory device. For example, the ultra-capacitive memory device 1100 in accordance with example embodiments of the present disclosure may include one bank or two banks to limit an area of the memory device. However, the number of banks is not limited thereto.

The row decoder 1120 may select at least one word line among word lines WLs according to the control of the peripheral circuit 1140. The row decoder 1120 may receive a row decoder control signal R_CTL and row addresses RA from the peripheral circuit 1140. The row decoder control signal R_CTL and the row addresses RA may be generated by the peripheral circuit 1140 in response to commands of the processor 110. For example, when an active command and addresses of word line that needs to be activated are input to the ultra-capacitive memory device 1100, the peripheral circuit 1140 may activate the row decoder control signal R_CTL and generate the row addresses RA. The row decoder 1120 may select at least one word line with reference to the row decoder control signal R_CTL and the row addresses RA. A set of memory cells connected to a selected word line may be considered as a selected page. When a precharge command is input to the ultra-capacitive memory device 1100, the peripheral circuit 1140 may deactivate the row decoder control signal R_CTL.

The column decoder 1130 may select at least one bit line among bit lines BLs according to the control of the peripheral circuit 1140. The column decoder 1130 may receive a column decoder control signal C_CTL and column addresses CA from the peripheral circuit 1140. A write or read command may be input to the ultra-capacitive memory device 1100 to store data in the selected page or read data from the selected page after the active command. To this end, the peripheral circuit 1140 may activate the column decoder control signal C_CTL and generate the column addresses CA. When a write or read operation is finished, the peripheral circuit 1140 may deactivate the column decoder control signal C_CTL.

The peripheral circuit 1140 may receive commands CMD and addresses ADD from the processor 110. The peripheral circuit 1140 may generate the row decoder control signal R_CTL, the row addresses RA, the column decoder control signal C_CTL or the column addresses CA in response to the commands CMD and the addresses ADD received from the processor 110. The peripheral circuit 1140 may transmit the row decoder control signal R_CTL and the row addresses RA to the row decoder 1120. The peripheral circuit 1140 may transmit the column decoder control signal C_CTL and the column addresses CA to the column decoder 1130.

The peripheral circuit 1140 may exchange input/output data with the processor 110. To this end, the peripheral circuit 1140 may include pads 1141 for the commands CMD, the addresses ADD, and the input/output data. Referring to FIG. 3, the pads 1141 may be disposed on edges of the ultra-capacitive memory device 1100. An area of the ultra-capacitive memory device 1100 may be reduced by reducing the number of banks or disposing the pads 1141 on edges of the ultra-capacitive memory device 1100.

Figure 4:
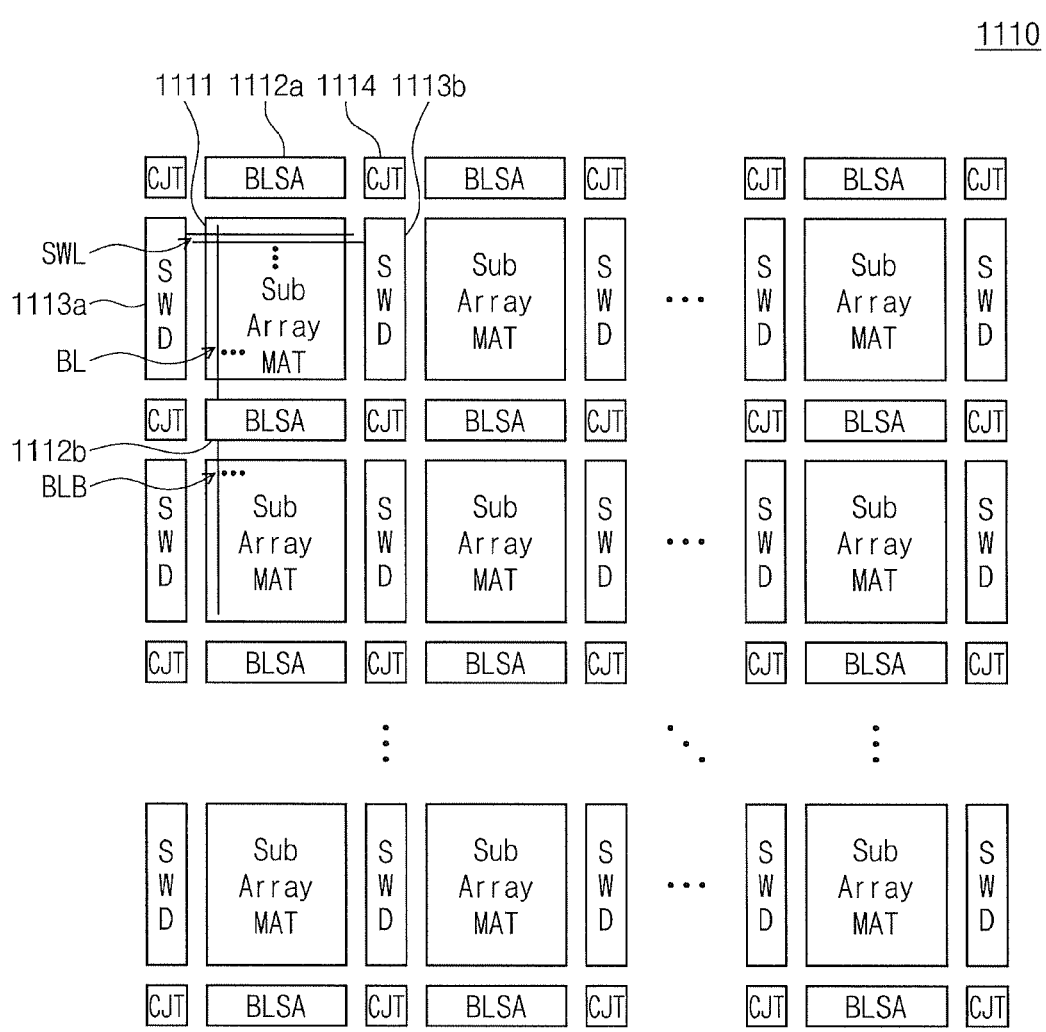
FIG. 4 is a block diagram illustrating a bank illustrated in FIG. 3.

FIG. 4 is a block diagram illustrating a bank (e.g., bank 1110 illustrated in FIG. 3). Referring to FIG. 4, the bank 1110 may include a plurality of arrays MATs 1111, a plurality of bit line sense amplifier circuits (BLSAs) 1112a and 1112b, a plurality of sub word line drivers (SWDs) 1113a and 1113b, and a plurality of conjunctions (CJTs) 1114.

The arrays MATs 1111 may include a plurality of sub word lines (SWLs) and a plurality of bit lines (BLs). The plurality of sub word lines (SWLs) may extend in a row direction and may be disposed along a column direction. The plurality of bit lines (BLs) may extend in the column direction and may be disposed along the row direction. The bit lines (BLs) may be sequentially driven by a BLSA 1112a and a BLSA 1112b. The sub word lines (SWLs) may be sequentially driven by a SWD 1113a and a SWD 1113b. It may be understood that this internal configuration arrangement does not limit the present disclosure.

The number of the BLs of the arrays MATs 1111 may be determined by the number of column addresses input to the memory device 1100. For example, the number of the BLs may be 1024. The number of the SWLs of an array MAT 1111 may be determined by a size of a capacitor (CS) of a DRAM cell and a size of a capacitor (CBL) of a bit line. For example, the number of the sub word lines (SWLs) may be 512, 640, 768, 832, 1024, 2048, 4096, etc.

A size, e.g., the number of the SWLs, of the array MAT 1111 may have a larger value to reduce an area of the ultra-capacitive memory device 1100. This may be because, for example, as a size of the array MAT 1111 increases, the number of the BLSAs 1112 and the CJTs 1114 may be reduced and thereby an area of the ultra-capacitive memory device 1100 may be reduced.

The BLSA 1112 can amplify a minute voltage difference between the bit line (BL) and a bit line bar (BLB). In the case where the processor 110 (refer to FIG. 1) inputs an active command into the memory device, the BLSA 1112 may operate after the SWL is activated and a specific time goes by. Referring to FIG. 4, the BLSA 1112 may be connected to the bit lines (BLs) and the bit line bars (BLBs). The BLSA 1112 may be repeatedly disposed between the array MATs 1111. A set of the BLSAs 1112 disposed in a row direction may be considered as a bit line sense amplifier array. It may be understood that this internal configuration arrangement does not limit the present disclosure. A structure of the BLSA 1112 will be described in FIG. 5.

The SWD 1113 (the SWDs 1113a and 1113b) may drive the sub word line (SWL). In the case where the processor 110 (refer to FIG. 1) inputs an active command into the memory device, the SWD 1113 may drive the SWL according to a control of the row decoder 1120 (illustrated in FIG. 3). Referring to FIG. 4, the SWD 1113 may be repeatedly disposed between the array MATs 1111. It may be understood that this internal configuration arrangement does not limit the present disclosure. Since a structure of the sub word line driver 1113 is expected to be well known to those skilled in the art, a description thereof is omitted.

The CJTs 1114 may be disposed between the BLSA 1112 and the SWD 1113. The CJTs 1114 may amplify signals that are used to control the BLSA 1112 or the SWD 1113 by the row decoder 1120 (illustrated in FIG. 3).

Figure 5:
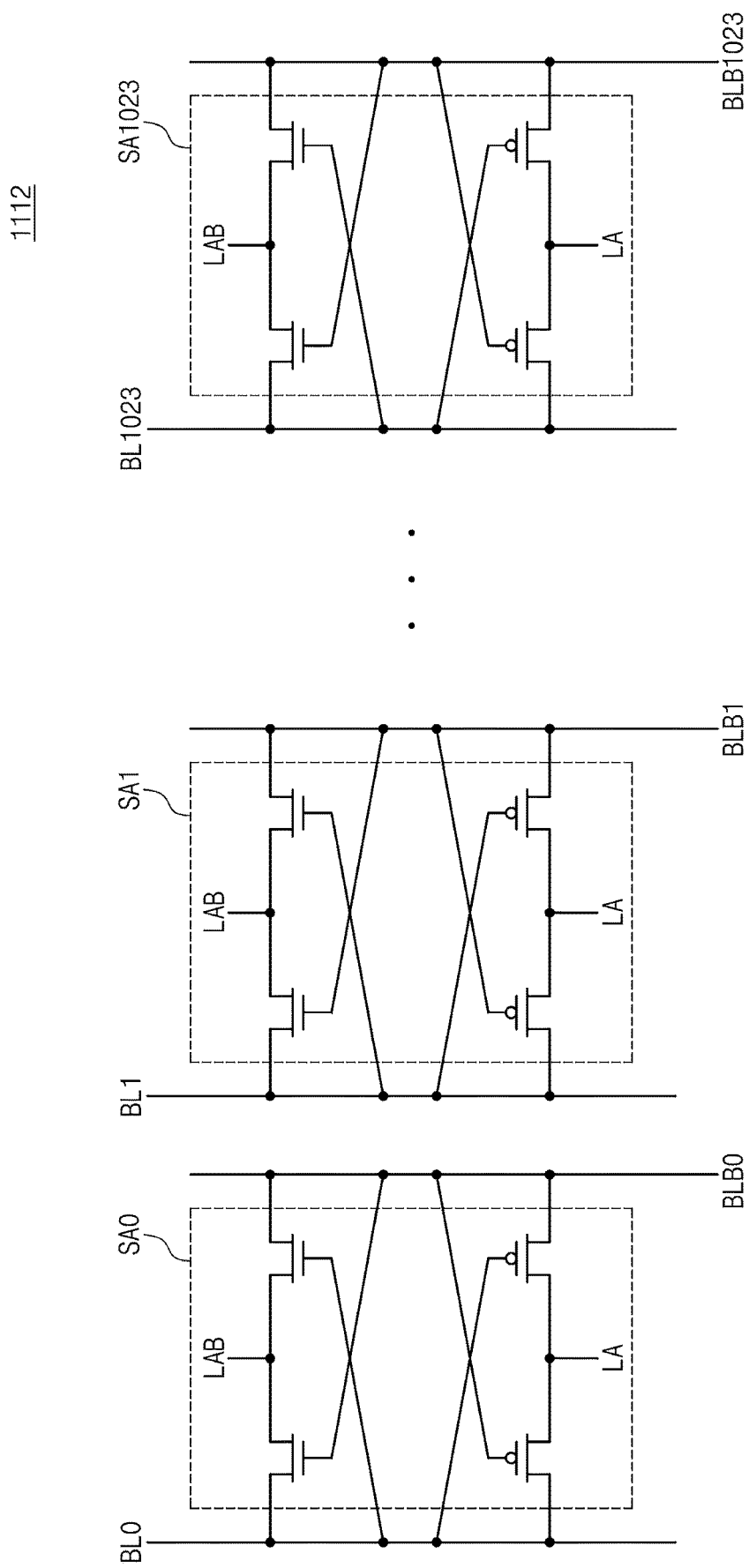
FIG. 5 is a block diagram illustrating a bit line sense amplifier circuit illustrated in FIG. 4.

FIG. 5 is a block diagram illustrating a bit line sense amplifier circuit illustrated in FIG. 4. Referring to FIG. 5, the bit line sense amplifier circuit 1112 may include bit line sense amplifiers (SA0 to SA1023). Each of the bit line sense amplifiers (SA0 to SA1023) may receive power supply signals (LA, LAB) from the row decoder 1120 (refer to FIG. 3). Each of the bit line sense amplifiers (SA0 to SA1023) may be connected to the bit line (BL) and the bit line bar (BLB). For example, the bit line sense amplifier (SA0) may be connected to a bit line (BL0) and a bit line bar (BLB0). Each of the bit line sense amplifiers (SA0 to SA1023) may amplify a minute voltage difference between the bit line (BL) and the bit line bar (BLB) and store an amplification result. A structure of each of the bit line sense amplifiers (SA0 to SA1023) is not limited to a structure of a SRAM (static random access memory) illustrated in FIG. 5.

Figure 6:
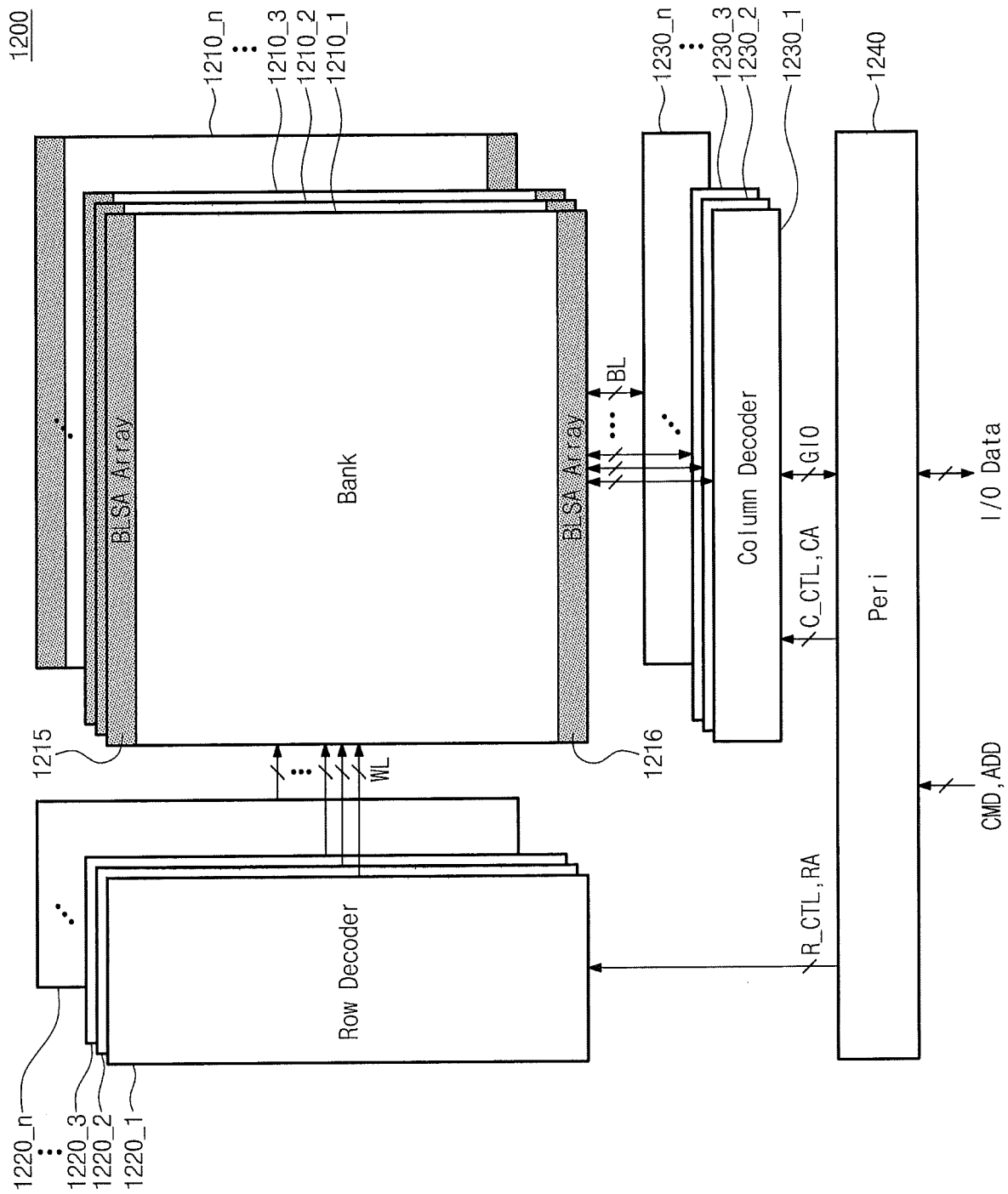
FIG. 6 is a block diagram illustrating a memory device in accordance with example embodiments of the present disclosure.

FIG. 6 is a block diagram illustrating a memory device in accordance with example embodiments of the present disclosure. Referring to FIG. 6, a memory device 1200 may include banks (1210_1 to 1210_n), row decoders (1220_1 to 1220_n), column decoders (1230_1 to 1230_n), and a peripheral circuit 1240. Here, n means the number of the banks. The memory device 1200 may include a plurality of banks. The memory device 1200 may include more banks than the ultra-capacitive memory device 1100 (refer to FIG. 3). The processor 110 (refer to FIG. 1) may access to the plurality of banks at the same time to perform a data input/output operation. Thus, a data input/output operation may be performed in the memory device 1200 more quickly than in the ultra-capacitive memory device 1100.

The bank 1210 may be substantially the same as the bank 1110 illustrated in FIG. 3. But, referring to FIG. 6, the bank 1210 may additionally include bit line sense amplifier arrays 1215 and 1216 unlike the bank 1110. The bank 1210 may include additional memories through the bit line sense amplifier arrays 1215 and 1216. The aforementioned additional memory may mean a buffer memory. An access time to the buffer memory may be reduced as compared with an access time to a general DRAM cell. Thus, the memory device 1200 may be able to quickly perform the cache operation described in FIG. 3 through the buffer memory. The buffer memory may store not only data by the cache operation but also write data transmitted by the processor 110 (refer to FIG. 1). Data stored in the buffer memory is not limited thereto. The buffer memory will be described in FIG. 8.

The row decoder 1220 may be substantially the same as the row decoder 1120 illustrated in FIG. 3 on the whole. Unlike the row decoder 1120, the row decoder 1220 may include a plurality of BLSA control circuits (BLSA CTRLs) to control the bit line sense amplifier arrays 1215 and 1216. The BLSA control circuits (BLSA CTRLs) will be described further below with reference to FIG. 8.

The column decoder 1230 performs the same function as the column decoder 1130 illustrated in FIG. 3. Referring to FIG. 6, unlike the column decoder 1130, the column decoder 1230 may temporarily store data stored in the bit line sense amplifier arrays 1215 and 1216. The column decoder 1230 may have the same structure as the column decoder 1130 or include additional circuits to perform a data input/output of the bit line sense amplifier arrays 1215 and 1216.

The peripheral circuit 1240 may be substantially the same as the peripheral circuit 1140 illustrated in FIG. 3 on the whole. The peripheral circuit 1240 may have the same structure as the peripheral circuit 1140 or include additional circuits to perform a data input/output of the bit line sense amplifier arrays 1215 and 1216. The additional circuits will be described further below with reference to FIG. 12.

Figure 7:
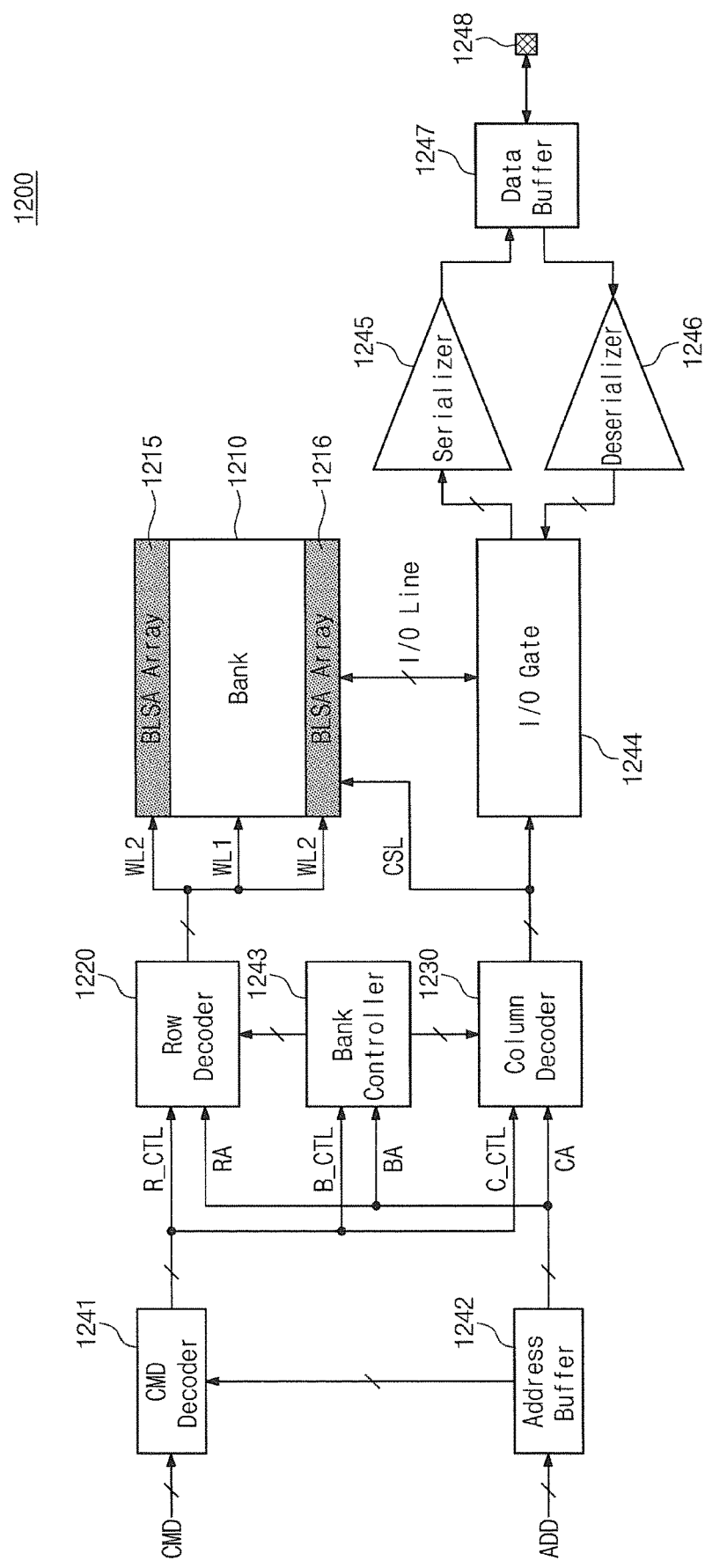
FIG. 7 is a block diagram illustrating a memory device in accordance with example embodiments of the present disclosure.

FIG. 7 is a block diagram illustrating a memory device in accordance with example embodiments of the present disclosure. Referring to FIG. 7, the memory device 1200 may include a bank 1210, a row decoder 1220, a column decoder 1230, a command decoder 1241, an address buffer 1242, a bank controller 1243, an input/output gate 1244, a serializer 1245, a deserializer 1246, a data buffer 1247, and a pad 1248.

Since the bank 1210, the row decoder 1220, and the column decoder 1230 are the same as those illustrated in FIG. 6 on the whole, a description thereof is omitted here. For brevity of description, in FIG. 7, only one bank 1210, one row decoder 1220, and one column decoder 1230 are illustrated, though the present disclosure is not limited by such illustration and brevity.

The command decoder 1241 may decode commands CMD received from the outside to generate control signals (e.g., R_CTL, B_CTL, C_CTL) for accessing to the bit line sense amplifier arrays 1215 and 1216. For example, the command decoder 1241 may decode a write enable signal WE, a row address strobe signal RAS, a column address strobe signal CAS, an active signal ACT, a chip select signal CS, address information transmitted from the address buffer 1242, etc. and may generate control signals corresponding to the command CMD.

The commands CMD may include commands for using general memory cells in the bank 1210 or commands for using the bit line sense amplifier arrays 1215 and 1216. For example, the commands described above may be an activation command, a read command, or a write command. The command decoder 1241 may receive additional signals from the outside to decode a command for using the bit line sense amplifier arrays 1215 and 1216.

The address buffer 1242 may receive addresses ADD from the outside. The address buffer 1242 may receive addresses ADD for selecting the bit line sense amplifier arrays 1215 and 1216. The address buffer 1242 may generate bank addresses BA, row addresses RA, and column addresses CA with reference to addresses ADD and commands CMD received from the outside. The address buffer 1242 may receive addresses ADD for accessing to the bit line sense amplifier arrays 1215 and 1216. The bank controller 1243 may select at least one of the banks with reference to the bank control signal B_CTL and the bank addresses BA. The bank controller 1243 may transmit control signals to a row decoder and a column decoder that control each of the banks.

The row decoder 1220 may select a plurality of first word lines WL1 or a plurality of second word lines WL2 with reference to the row decoder control signal R_CTL, a control of the bank controller 1243, and the row addresses RA. The row decoder 1220 may select the first word lines WL1 for accessing to general memory cells or the second word lines WL2 for accessing to bit line sense amplifier arrays 1215 and 1216. In the case where a second word line WL2 is selected by the row decoder 1220, bit line sense amplifiers connected to a selected second word line WL2 may be activated.

The column decoder 1230 may generate select signals CSL to use memory cells connected to a first word line WL1 selected by the row decoder 1220 with reference to the column decoder control signal C_CTL, a control of the bank controller 1243, and the column addresses CA. The column decoder 1230 may generate select signals CSL to use bit line sense amplifiers connected to a selected second word line WL2. When the select signals CSL are transmitted to the bank 1210, data stored in the bit line sense amplifiers connected to the selected second word line WL2 may be transmitted to an input/output line (I/O line). Alternatively, data may be transmitted to the bit line sense amplifiers through the input/output line (I/O line). In another embodiment, the column decoder 1230 may not generate the select signals CSL. In this case, a read operation or a write operation may be performed with respect to all the bit line sense amplifiers connected to the selected second word line WL2.

The input/output gate 1244 may be connected to the input/output line, the serializer 1245, and the deserializer 1246. The input/output gate 1244 may write data in the bit line sense amplifier arrays 1215 and 1216 or may sense data from the bit line sense amplifier arrays 1215 and 1216 through the input/output line. The input/output gate 1244 may receive control signals from the column decoder 1230 to perform the read operation or the write operation. Although not illustrated, the input/output gate 1244 may directly receive control signals from the command decoder 1241. The input/output gate 1244 may transmit read data to the serializer 1245 or may receive write data from the deserializer 1246.

The serializer 1245 may serialize data stored in the bit line sense amplifier arrays 1215 and 1216 to transmit the serialized data to the data buffer 1247. The deserializer 1246 may deserialize data to be written in the bit line sense amplifier arrays 1215 and 1216 and may transmit the deserialized data to the input/output gate 1244. The data buffer 1247 may be connected to the serializer 1245, the deserializer 1246, and the pad 1248 to perform a data input/output.

Figure 8:
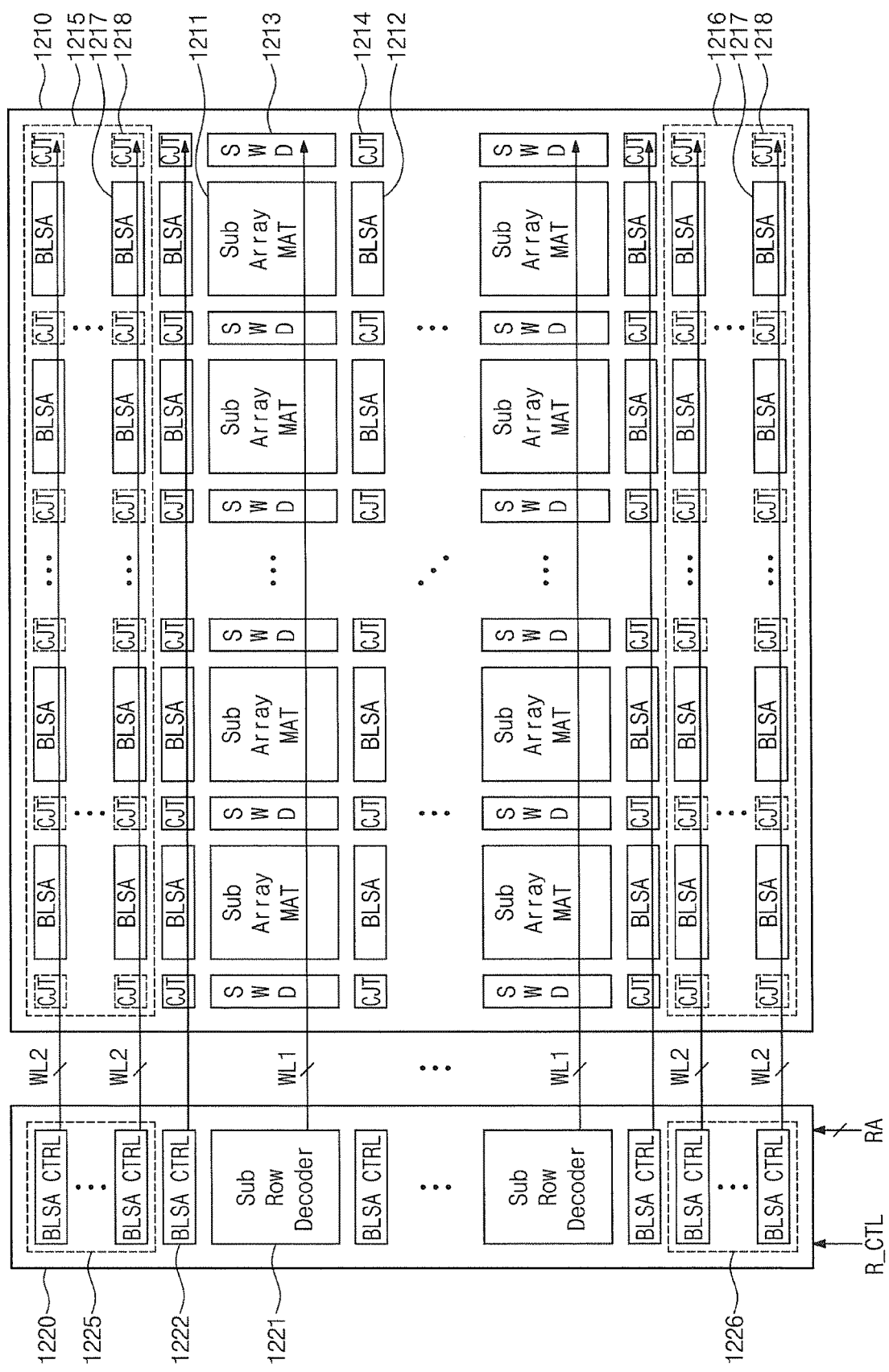
FIG. 8 is a block diagram illustrating a bank and a row decoder illustrated in FIG. 6.

FIG. 8 is a block diagram illustrating a bank and a row decoder illustrated in FIG. 6. Referring to FIG. 8, the bank 1210 may include a plurality of arrays MATs 1211, a plurality of bit line sense amplifier circuits (BLSAs) 1212, a plurality of sub word line drivers (SWDs) 1213, and a plurality of conjunctions (CJTs) 1214. Since the arrays MATs 1211, the BLSAs 1212, the SWDs 1213, and the CJTs 1214 perform the same function as the arrays MATs 1111, the BLSAs 1112, the SWDs 1113, and the CJTs 1114 illustrated in FIG. 4, a description thereof is omitted here.

Unlike the bank 1110 (illustrated in FIG. 3), the bank 1210 may further include the bit line sense amplifier arrays 1215 and 1216. The bit line sense amplifier arrays 1215 and 1216 may operate independently of the arrays MATs 1211.

Referring to FIG. 8, the bit line sense amplifier arrays 1215 and 1216 may be disposed at both ends of the bank 1210. Alternatively, the bit line sense amplifier array may be disposed only at one end of the bank 1210. Alternatively, the bit line sense amplifier array may be disposed at a position exclusive of both ends of the bank 1210. Each of the bit line sense amplifier arrays 1215 and 1216 may include a plurality of bit line sense amplifier circuits (BLSAs) 1217. Each of the bit line sense amplifier arrays 1215 and 1216 may include or, in some aspects, might not include a plurality of conjunctions (CJTs) 1218. The bit line sense amplifier circuit 1217 may be the same as or different from the BLSA 1212. In the case where the bit line sense amplifier circuit 1217 is different from the BLSA 1212, an internal structure of the bit line sense amplifier circuit 1217 may be different from an internal structure of the BLSA 1212. The bit line sense amplifier circuit 1217 may be constituted by SRAM cells (not illustrated). Similarly, an internal structure of the conjunction 1218 may be the same as or different from the CJT 1214. In the case where an internal structure of the conjunction 1218 is different from the CJT 1214, the conjunction 1218 may be configured to operate independently of the SWD 1213.

To include a buffer memory with low cost, the memory device 1200 may use the bit line sense amplifier circuit 1212 used in the bank 1210 as it is. The bit line sense amplifier circuit 1217 may include bit line sense amplifiers (refer to FIG. 5) on the inside and each bit line sense amplifier may operate as a SRAM cell. The bit line sense amplifier circuit 1217 has a characteristic of SRAM cell and thus data stored in the bit line sense amplifier circuit 1217 does not need a refresh operation performed in a DRAM cell.

In an embodiment, read data stored in the bit line sense amplifier circuit 1217 may be transmitted to the peripheral circuit 1240 (refer to FIG. 6) through input/output lines (not illustrated) connected to the BLSA 1212. Write data may be transmitted from the peripheral circuit 1240 to the bit line sense amplifier circuit 1217 through the input/output lines (not illustrated). That is, the input/output lines (not illustrated) for accessing to the array MATs 1211 may be used to access to the bit line sense amplifier circuit 1217.

In another embodiment, read data stored in the bit line sense amplifier circuit 1217 may be transmitted to the peripheral circuit 1240 through input/output lines (not illustrated) which are irrelevant to the array MATs 1211. Write data may be transmitted from the peripheral circuit 1240 to the bit line sense amplifier circuit 1217 through input/output lines (not illustrated) which are irrelevant to the array MATs 1211.

Capacity of the buffer memory is proportional to the number of the bit line sense amplifier circuits 1217. For example, in the case where 1024 bit line sense amplifiers exist in the bit line sense amplifier circuit 1217, the capacity of the buffer memory becomes a value obtained by multiplying 1024 by the number of the bit line sense amplifier circuits 1217. In the case where the memory device 1200 includes a plurality of banks, the capacity of the buffer memory becomes a value obtained by multiplying the number of banks by the value obtained by multiplying 1024 by the number of the bit line sense amplifier circuits 1217.

Referring to FIG. 8, the row decoder 1220 may include a plurality of sub row decoders 1221, a plurality of bit line sense amplifier control circuits (BLSA CTRLSs) 1222, 1225, and 1226.

The sub row decoder 1221 may select at least one of the first word lines WL1 according to the control of the peripheral circuit 1240 and may activate the selected first word line WL1. The bit line sense amplifier control circuit 1222 may control the bit line sense amplifier circuits 1212 according to the control of the peripheral circuit 1240. In the case where an active command is input in the memory device 1200, the bit line sense amplifier control circuit 1222 may activate the bit line sense amplifier circuits 1212. The bit line sense amplifier control circuit 1222 may activate the bit line sense amplifier circuits 1212 adjacent to the selected first word line WL1. In the case where a precharge command is input in the memory device 1200, the bit line sense amplifier control circuit 1222 may deactivate the bit line sense amplifier circuits 1212. Referring to FIG. 8, the sub row decoder 1221 and the bit line sense amplifier circuit 1222 may be alternately and repeatedly disposed along a column direction.

Each of the plurality of BLSA CTRLs 1225 and 1226 may control the plurality of bit line sense amplifier circuits 1217. Each of the plurality of BLSA CTRLs 1225 and 1226 may also control the plurality of conjunctions 1218. Each of the plurality of BLSA CTRLs 1225 and 1226 may control the plurality of bit line sense amplifier circuits 1217 or the plurality of conjunctions 1218 disposed in one row through the second word lines (WL2). Each of the plurality of BLSA CTRLs 1225 and 1226 may be the same as or different from the bit line sense amplifier control circuit 1222. In the case where each of the plurality of BLSA CTRLs 1225 and 1226 is different from the BLSA CTRL 1222, each of the plurality of BLSA CTRLs 1225 and 1226 may include additional circuits (not illustrated) for reading data stored in the bit line sense amplifier circuits 1217 or writing data in the bit line sense amplifier circuits 1217. In the case where each of the plurality of BLSA CTRLs 1225 and 1226 is the same as the BLSA CTRL 1222, the memory device 1200 may use the BLSA CTRL 1222 used in the row decoder 1220 to control the buffer memory (bit line sense amplifier arrays 1215 and 1216) as it is.

The processor 110 (refer to FIG. 1) may provide additional row addresses (not illustrated) to the memory device 1200 to use the buffer memory (bit line sense amplifier arrays 1215 and 1216). The provided row addresses are sequentially transmitted to the peripheral circuit 1240 and the row decoder 1220 and then are transmitted to the BLSA CTRLs 1225 and 1226.

The time taken for the processor 110 (refer to FIG. 1) to access to the buffer memory (bit line sense amplifier arrays 1215 and 1216) may be relatively reduced as compared with the time for the processor 110 (refer to FIG. 1) to access to a general DRAM cell region. For example, a reduced time may be tRCD. In the case where the processor 110 accesses to the buffer memory (bit line sense amplifier arrays 1215 and 1216), since the buffer memory (bit line sense amplifier arrays 1215 and 1216) includes SRAM cells, there is no need for a process of amplifying a minute voltage difference to read DRAM cells. The buffer memory (bit line sense amplifier arrays 1215 and 1216) may operate at high speed as compared with DRAM cell.

Figure 9:
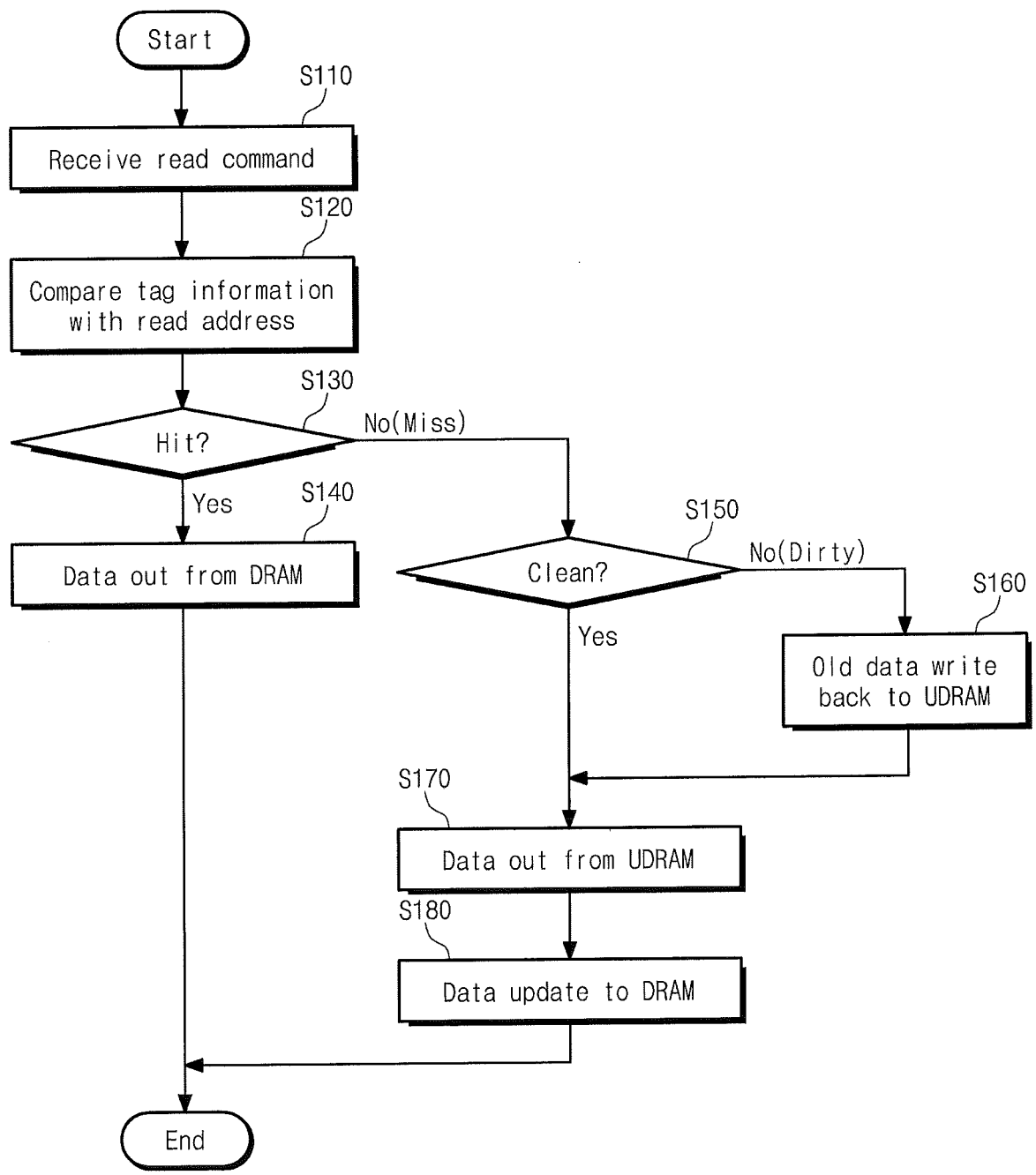
FIG. 9 is a flowchart illustrating a process in which a read command is performed with respect to a memory module in accordance with example embodiments of the present disclosure.

FIG. 9 is a flowchart illustrating a process in which a read command is performed with respect to a memory module in accordance with example embodiments of the present disclosure. FIG. 9 will be described with reference to FIGS. 1, 2 and 6.

In an operation S110, the memory module 1000 (refer to FIG. 2) may receive a read command from the processor 110 (refer to FIG. 1). The memory module 1000 may also receive read addresses corresponding to the read command from the processor 110.

In an operation S120, the register clock driver 1500 (refer to FIG. 2) may receive tag information from the third memory device 1300 (refer to FIG. 2). The register clock driver 1500 (refer to FIG. 2) may compare the tag information received from the third memory device 1300 with tag information included in the read addresses received from the processor 110.

In an operation S130, with reference to a comparison result in the operation S120, the register clock driver 1500 (refer to FIG. 2) may check whether the aforementioned tag information hits each other. In the case where the aforementioned tag information hits each other (Yes branch from operation S130), an operation S140 may be executed. In the case where the aforementioned tag information does not hit each other (No, Miss branch from operation S140), an operation S150 may be executed.

In an operation S140, the register clock driver 1500 (refer to FIG. 2) may output read data from the first and second memory devices 1200a and 1200b (refer to FIG. 2). The read data may be output from the first and second memory devices 1200a and 1200b more quickly than the first and second ultra-capacitive memory devices 1100a and 1100b.

In an operation S150, the register clock driver 1500 (refer to FIG. 2) may check whether data inside the first and second memory devices 1200a and 1200b (refer to FIG. 2) is stored in the first and second ultra-capacitive memory devices 1100a and 1100b (refer to FIG. 2). In the case where the data is stored (Yes branch from operation S150), an operation S170 may be performed. In the case where the data is not stored (No, Dirty branch from operation S150), operations S160 and S170 may be performed subsequently.

In the operation S160, the register clock driver 1500 (refer to FIG. 2) may store old data stored in the first and second memory devices 1200a and 1200b (refer to FIG. 2) in the first and second ultra-capacitive memory devices 1100a and 1100b (refer to FIG. 2) (write back or migration). To perform the operation S160, the register clock driver 1500 (refer to FIG. 2) may write old data in the buffer memory (bit line sense amplifier arrays 1215 and 1216) instead of immediately writing the old data in the first and second ultra-capacitive memory devices 1100a and 1100b (refer to FIG. 2). As described above, the time taken to access to the buffer memory (bit line sense amplifier arrays 1215 and 1216) may be relatively reduced as compared with the time taken to access to a general DRAM cell. The operation S160 may be completed by writing, by the register clock driver 1500 (refer to FIG. 2), the old data in the buffer memory (bit line sense amplifier arrays 1215 and 1216). After that, the register clock driver 1500 (refer to FIG. 2) may store the old data stored in the buffer memory (bit line sense amplifier arrays 1215 and 1216) in the first and second ultra-capacitive memory devices 1100*a* and 1100*b* (refer to FIG. 2) (write back or migration). The method may then proceed to the operation S170.

In the operation S170, the register clock driver 1500 (refer to FIG. 2) may output read data from the first and second ultra-capacitive memory devices 1100*a* and 1100*b* (refer to FIG. 2). The read data may be delayed more in the first and second ultra-capacitive memory devices 1100*a* and 1100*b* (refer to FIG. 2) to be output than in the first and second memory devices 1200*a* and 1200*b* (refer to FIG. 2). The method may then proceed to an operation S180.

In an operation S180, the register clock driver 1500 (refer to FIG. 2) may store read data being output or to be output to the processor 110 (refer to FIG. 1) in the first and second memory devices 1200*a* and 1200*b* (refer to FIG. 2) (update). Data read by the processor 110 (refer to FIG. 1) through the memory module 1000 (refer to FIG. 2) may be more likely to be read again in the near time. Thus, the register clock driver 1500 (refer to FIG. 2) may store the read data in the first and second memory devices 1200*a* and 1200*b* (refer to FIG. 2) that operate as a cache.

To perform the operation S180, the register clock driver 1500 (refer to FIG. 2) may store read data in the buffer memory (bit line sense amplifier arrays 1215 and 1216) instead of immediately storing the read data in the banks (1210_1 to 1210_*n*) (refer to FIG. 6). As described above, the time taken to access to the buffer memory (bit line sense amplifier arrays 1215 and 1216) may be relatively reduced as compared with the time taken to access to a general DRAM cell. The operation S180 may be completed by storing, by the register clock driver 1500 (refer to FIG. 2), the read data in the buffer memory (bit line sense amplifier arrays 1215 and 1216). After that, the register clock driver 1500 (refer to FIG. 2) may store the old data stored in the buffer memory (bit line sense amplifier arrays 1215 and 1216) in the read data in the banks (1210_1 to 1210_*n*) (refer to FIG. 6).

Figure 10:
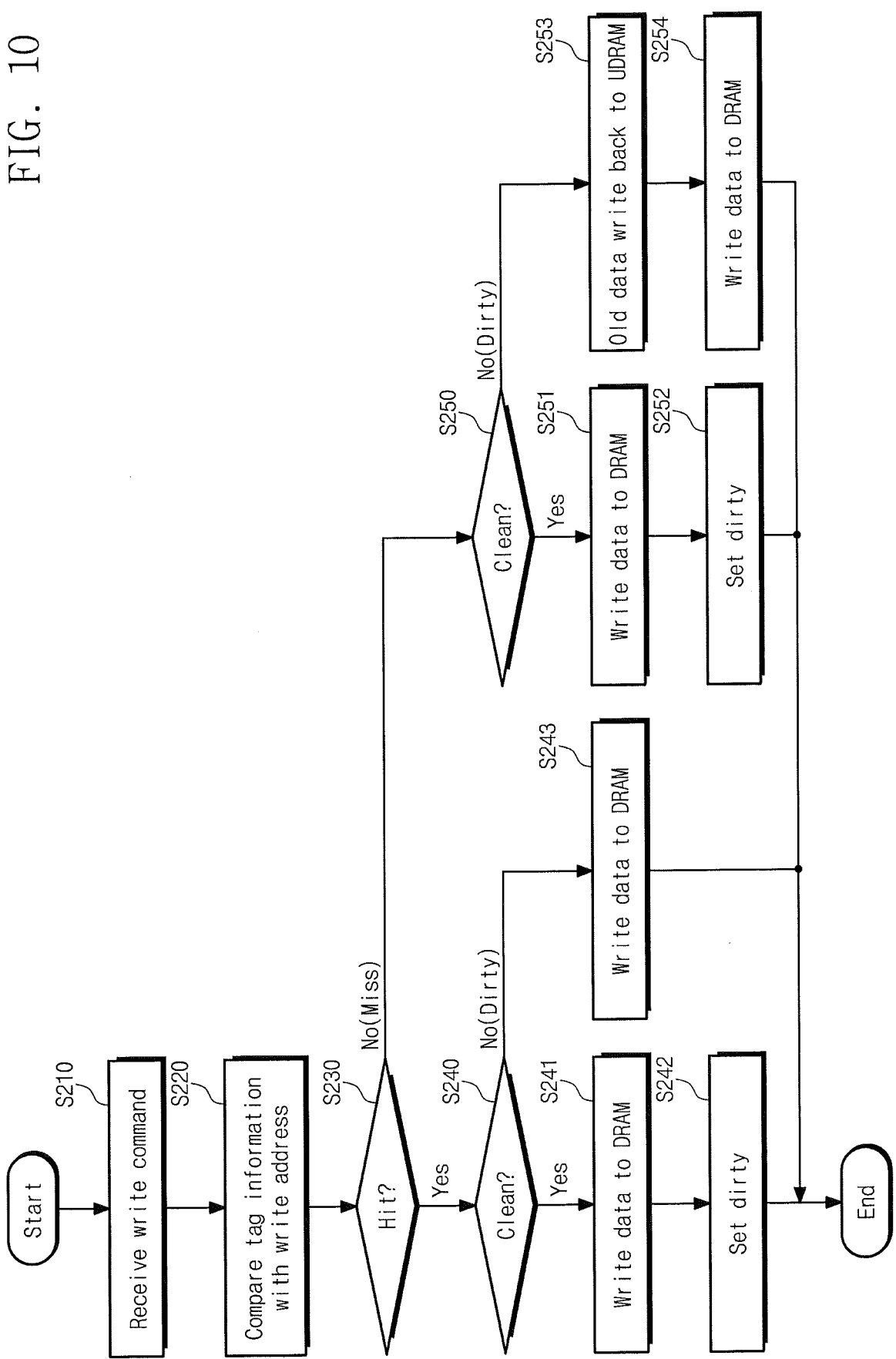
FIG. 10 is a flowchart illustrating a process in which a write command is executed with respect to a memory module in accordance with example embodiments of the present disclosure.

FIG. 10 is a flowchart illustrating a process in which a write command is executed with respect to a memory module in accordance with example embodiments of the present disclosure. FIG. 10 will be described with reference to FIGS. 1, 2 and 6.

In an operation S210, the memory module 1000 (refer to FIG. 2) may receive a write command from the processor 110 (refer to FIG. 1). The memory module 1000 may also receive write addresses corresponding to the write command from the processor 110 during the operation S210.

In an operation S220, the register clock driver 1500 (refer to FIG. 2) may receive tag information from the third memory device 1300 (refer to FIG. 2). The register clock driver 1500 may compare the tag information described above with tag information included in the write addresses received from the processor 110.

In an operation S230, with reference to a comparison result in the operation S220, the register clock driver 1500 (refer to FIG. 2) may check whether the aforementioned tag information hits each other. In the case where the aforementioned tag information hits each other (Yes branch from operation S210), an operation S240 may be executed. In the case where the aforementioned tag information does not hit each other (No, Miss branch from operation S230), an operation S250 may be executed. The write data may be stored in the first and second memory devices 1200*a* and 1200*b* (refer to FIG. 2) regardless of whether the aforementioned tag information hits each other.

In the operation S240, the register clock driver 1500 (refer to FIG. 2) may check whether data inside the first and second memory devices 1200*a* and 1200*b* (refer to FIG. 2) is stored in the first and second ultra-capacitive memory devices 1100*a* and 1100*b* (refer to FIG. 2). In the case where the data is stored (Yes branch from operation S240), an operation S241 may be performed. In the case where the data is not stored (No, Dirty branch from operation S240), an operation S243 may be performed.

In the operation S241, the register clock driver 1500 (refer to FIG. 2) may store the write data in the first and second memory devices 1200*a* and 1200*b* (refer to FIG. 2). The method may then proceed to the operation S242. In the operation S242, since the write data stored in the first and second memory devices 1200*a* and 1200*b* (refer to FIG. 2) becomes different from the write data stored in the first and second ultra-capacitive memory devices 1100*a* and 1100*b* (refer to FIG. 2), the register clock driver 1500 (refer to FIG. 2) may set a dirty bit. The dirty bit may indicate that the write data stored in the first and second memory devices 1200*a* and 1200*b* (refer to FIG. 2) is different from the write data stored in the first and second ultra-capacitive memory devices 1100*a* and 1100*b* (refer to FIG. 2). The dirty bit may be stored in the first, second or third memory device 1200*a*, 1200*b* or 1300 (refer to FIG. 2).

In the operation S243, the register clock driver 1500 (refer to FIG. 2) may store the write data in the first and second memory devices 1200*a* and 1200*b* (refer to FIG. 2). Since the dirty bit is already set before the operation S243 is performed, the register clock driver 1500 (refer to FIG. 2) does not need to perform the operation S242.

In an operation S250, which as discussed above is performed if the tag information received from the third memory device 1300 does not hit the tag information included in the write addresses received from the processor 110, the register clock driver 1500 (refer to FIG. 2) may check whether data inside the first and second memory devices 1200*a* and 1200*b* (refer to FIG. 2) is stored in the first and second ultra-capacitive memory devices 1100*a* and 1100*b* (refer to FIG. 2). In the case where the data is stored (Yes branch from operation S250), an operation S251 may be performed. In the case where the data is not stored (No, Dirty branch from operation S250), an operation S253 may be performed.

In the operation S251, in the case where data inside the first and second memory devices 1200*a* and 1200*b* (refer to FIG. 2) is stored in the first and second ultra-capacitive memory devices 1100*a* and 1100*b* (refer to FIG. 2), the register clock driver 1500 (refer to FIG. 2) may store the write data in the first and second memory devices 1200*a* and 1200*b* (refer to FIG. 2).

The method may then proceed to an operation S252. In the operation S252, since the write data stored in the first and second memory devices 1200*a* and 1200*b* (refer to FIG. 2) becomes different from the write data stored in the first and second ultra-capacitive memory devices 1100*a* and 1100*b* (refer to FIG. 2), the register clock driver 1500 (refer to FIG. 2) may set the dirty bit.

In the operation S253, the register clock driver 1500 (refer to FIG. 2) may store old data stored in the first and second memory devices 1200*a* and 1200*b* (refer to FIG. 2) in the first and second ultra-capacitive memory devices 1100*a* and 1100*b* (refer to FIG. 2) (write back or migration). To perform the operation S253, the register clock driver 1500 (refer to FIG. 2) may write old data in the buffer memory (bit line sense amplifier arrays 1215 and 1216 (refer to FIG. 6) of the first and second memory devices 1200*a* and 1200*b* (refer to FIG. 2) instead of immediately writing the old data in the first and second ultra-capacitive memory devices 1100a and 1100b (refer to FIG. 2). As described above, the time taken to access to the buffer memory (bit line sense amplifier arrays 1215 and 1216) may be relatively reduced as compared with the time taken to access to a general DRAM cell. The operation S253 may be completed by writing, by the register clock driver 1500 (refer to FIG. 2), the old data in the buffer memory (bit line sense amplifier arrays 1215 and 1216). After that, the register clock driver 1500 (refer to FIG. 2) may store the old data stored in the buffer memory (bit line sense amplifier arrays 1215 and 1216) in the first and second ultra-capacitive memory devices 1100a and 1100b (refer to FIG. 2) (write back or migration). The method may then proceed to an operation S254.

In the operation S254, the register clock driver 1500 (refer to FIG. 2) may store the write data in the first and second memory devices 1200a and 1200b (refer to FIG. 2). Since a dirty bit is already set before the operation S254 is performed, the register clock driver 1500 (refer to FIG. 2) does not need to perform the operation S252.

Through FIGS. 9 and 10, a process in which the memory module 1000 (refer to FIG. 2) performs a read command and a write command was described. The memory module 1000 (refer to FIG. 2) may include both the first and second memory devices 1200a and 1200b (refer to FIG. 2) having relatively fast access time and small capacity and the first and second ultra-capacitive memory devices 1100a and 1100b (refer to FIG. 2) having relatively slow access time and large capacity. To overcome a difference between time taken to access the first and second memory devices 1200a and 1200b (refer to FIG. 2) and time taken to access the first and second ultra-capacitive memory devices 1100a and 1100b (refer to FIG. 2), the first and second memory devices 1200a and 1200b (refer to FIG. 2) may include additionally the buffer memory (bit line sense amplifier arrays 1215 and 1216 (refer to FIG. 6)) having very fast access time. Thus, the memory module 1000 (refer to FIG. 2) may effectively perform a migration operation (S160, S253) of data from the first and second memory devices 1200a and 1200b (refer to FIG. 2) to the first and second ultra-capacitive memory devices 1100a and 1100b (refer to FIG. 2) through the buffer memory (bit line sense amplifier arrays 1215 and 1216). The memory module 1000 (refer to FIG. 2) may also effectively perform a migration operation (S180) of data from the first and second ultra-capacitive memory devices 1100a and 1100b (refer to FIG. 2) to the first and second memory devices 1200a and 1200b (refer to FIG. 2) through the buffer memory (bit line sense amplifier arrays 1215 and 1216).

Figure 11:
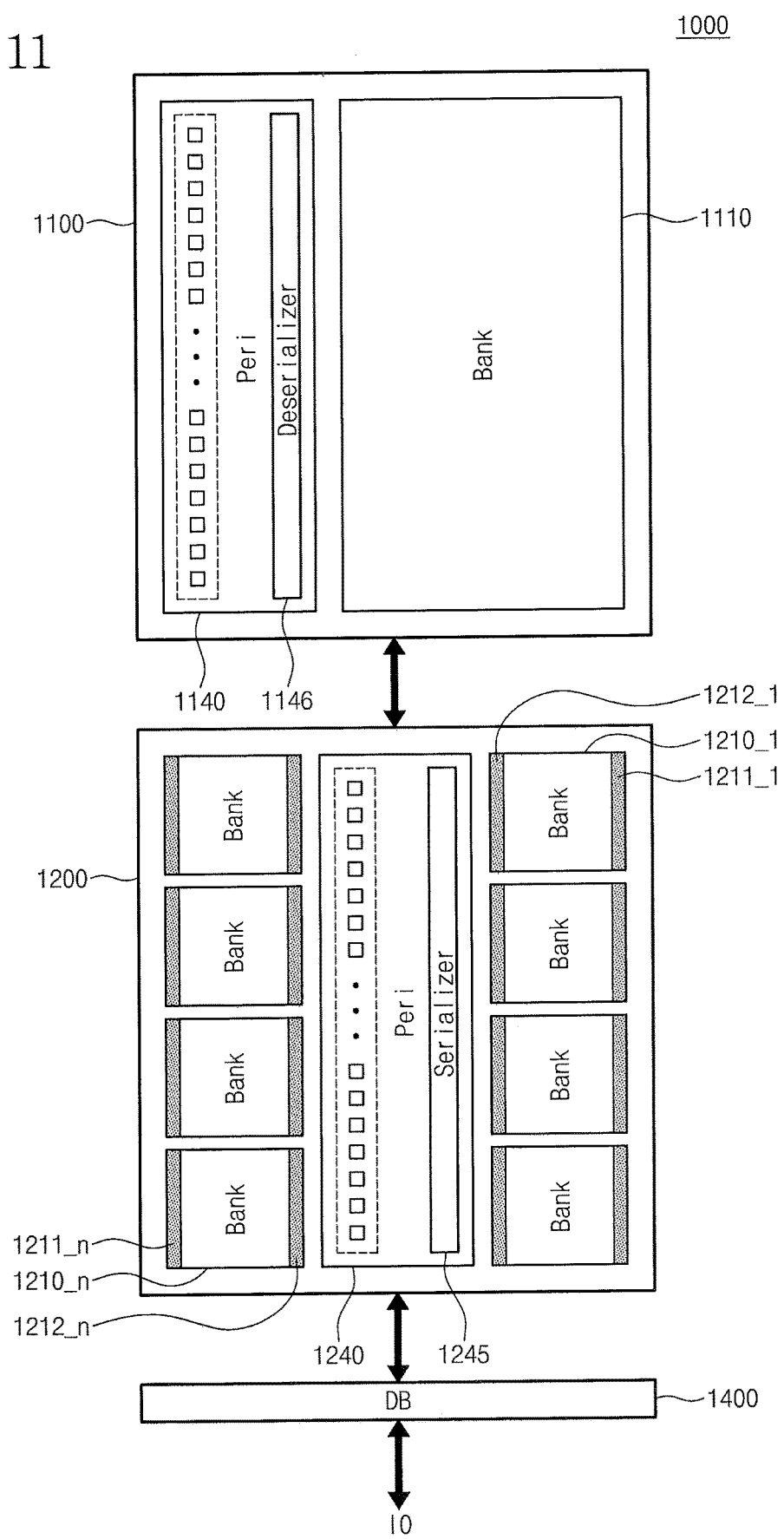
FIG. 11 is a view illustrating a part of a memory module in accordance with example embodiments of the present disclosure.

FIG. 11 is a view illustrating a part of memory module in accordance with example embodiments of the present disclosure. Referring to FIG. 11, the memory module 1000 may include an ultra-capacitive memory device 1100, a memory device 1200, and a data buffer 1400. FIG. 11 will be described with reference to FIGS. 3, 6, 8, 9 and 10.

The ultra-capacitive memory device 1100 may include the bank 1110 and the peripheral circuit 1140. Since the bank 1110 and the peripheral circuit 1140 were described in detail above in reference to FIG. 3, a description thereof is omitted here. Referring to FIG. 11, the peripheral circuit 1140 may further include a deserializer 1146. Although not illustrated, the deserializer 1146 may be dispersively disposed in the bank 1110. In the case where data is migrated from the memory device 1200 to the ultra-capacitive memory device 1100, the deserializer 1146 may deserialize the data transmitted from the memory device 1200. The deserialized data may be transmitted to the bank 1110.

The memory device 1200 may include the banks (1210_1 to 1210_n) and the peripheral circuit 1240. Since the bank 1210 was described in detail above in reference to FIGS. 6 and 8, a description thereof is omitted here. Referring to FIG. 11, the peripheral circuit 1240 may include a serializer 1245. Although not illustrated, the serializer 1245 may be dispersively disposed in the bank 1110. In the case where data is migrated from the memory device 1200 to the ultra-capacitive memory device 1100 (S160, S253), the serializer 1245 may serialize data stored in buffer memories (1211_1 to 1211_n, 1212_1 to 1212_n). The serializer 1245 may serialize data stored in the banks (1210_1 to 1210_n). Although not illustrated, the serializer 1245 may include a clock generation circuit on the inside. The serialized data may be transmitted to the ultra-capacitive memory device 1100.

A transmission method may be a single-ended method or a differential-ended method. For example, a transmission speed of the serialized data may be improved by a multi-level signaling In an embodiment, data may be transmitted from the ultra-capacitive memory device 1100 to the memory device 1200. That is, a duplex communication may be performed between the ultra-capacitive memory device 1100 and the memory device 1200. To perform a duplex communication, an additional channel may be provided between the ultra-capacitive memory device 1100 and the memory device 1200.

Since the data buffer 1400 was described in detail above in reference to FIG. 2, a description thereof is omitted.

Figure 12:
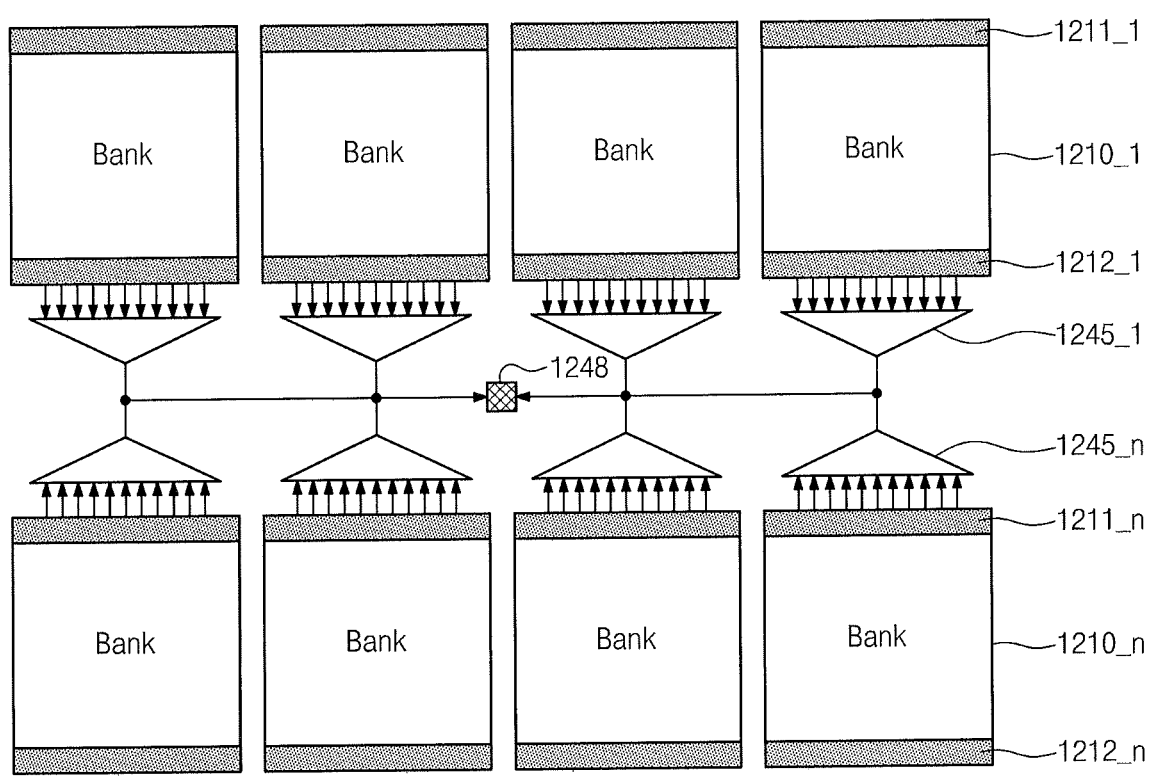
FIGS. 12 through 14 are views illustrating a memory device in accordance with example embodiments of the present disclosure.

FIG. 12 is a view illustrating a memory device in accordance with example embodiments of the present disclosure. FIG. 12 will be described with reference to FIGS. 8 and 11. Referring to FIG. 12, the memory device 1200 may include the banks (1210_1 to 1210_n), serializers (1245_1 to 1245_n), and the pad (DQE) 1248.

Since the banks (1210_1 to 1210_n) were described in detail above with reference to FIG. 8, a description thereof is omitted. Unlike FIG. 11, in FIG. 12 the memory device 1200 may include a plurality of serializers (1245_1 to 1245_n). The plurality of serializers (1245_1 to 1245_n) may be included in a peripheral circuit (not illustrated) or in the banks (1210_1 to 1210_n). Each of the serializers (1245_1 to 1245_n) may serialize data stored in each of the buffer memories (1211_1 to 1211_n, 1212_1 to 1212_n). The serialized data may be transmitted to the ultra-capacitive memory device 1100 through the pad 1248. Although only one pad 1248 is illustrated in FIG. 12, the number of the pads 1248 may be two or more. Although not illustrated, the serialized data may be transmitted to the ultra-capacitive memory device 1100 through an existing pad (not illustrated) through which data stored in the banks (1210_1 to 1210_n) is output.

Figure 13:
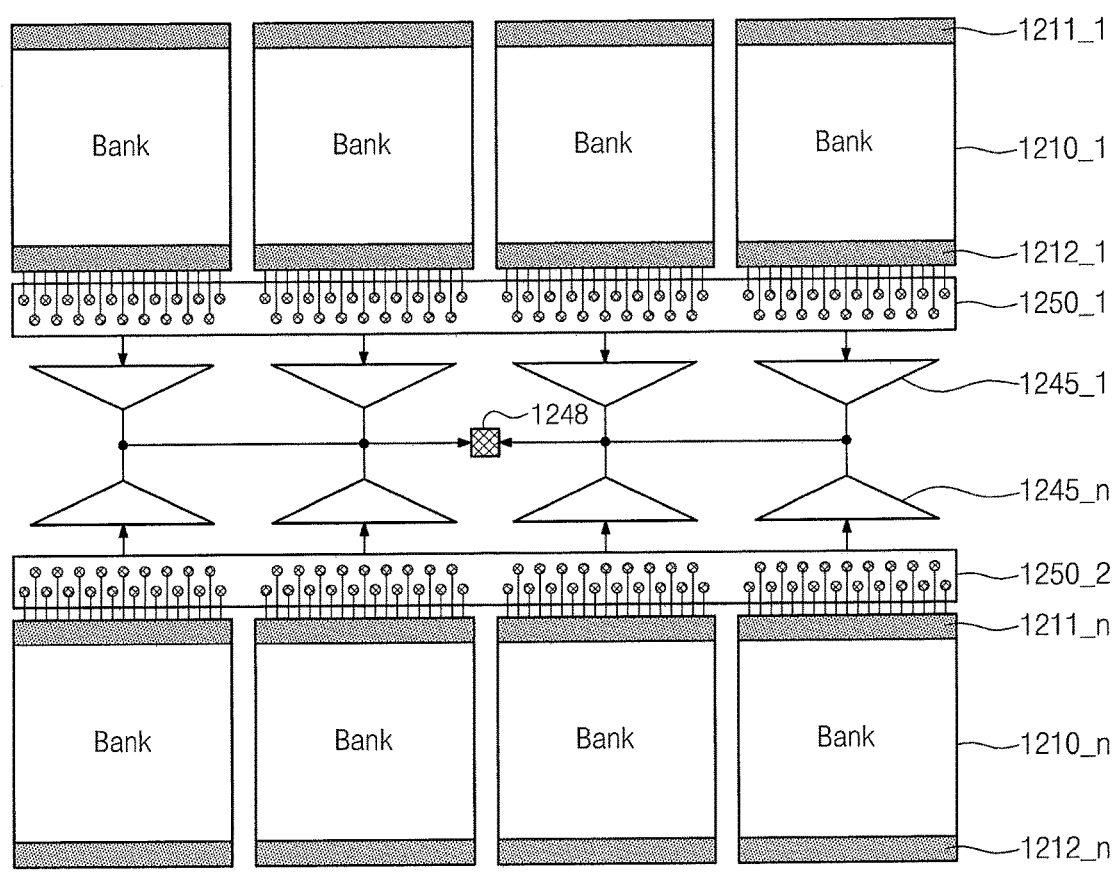

FIG. 13 is a view illustrating a memory device in accordance with example embodiments of the present disclosure. Referring to FIG. 13, the memory device 1200 may include the banks (1210_1 to 1210_n), the serializers (1245_1 to 1245_n), the pad (DQE) 1248, and through silicon via (TSV) areas (1250_1 and 1250_2). Since the banks (1210_1 to 1210_n), serializers (1245_1 to 1245_n), and the pad (DQE) 1248 were described in detail above with reference to FIG. 12, a description thereof is omitted here.

Each of the TSV areas (1250_1 and 1250_2) may be a path through which data stored in the buffer memories (1211_1 to 1211_n, 1212_1 to 1212_n) moves. Also, each of the TSV areas (1250_1 and 1250_2) may be a path through which data stored in the banks (1210_1 to 1210_n) moves. The memory module 1000 may include the memory devices 1200 stacked through the TSV areas (1250_1 and 1250_2) to increase its capacity. Data stored in the buffer memories (1211_1 to 1211_n, 1212_1 to 1212_n) may be transmitted to the serializers (1245_1 to 1245_n) of the lowermost memory device 1200 through the respective TSV areas (1250_1 and 1250_2). Data stored in the banks (1210_1 to 1210_n) may be transmitted to the serializers (1245_1 to 1245_n) of the lowermost memory device 1200 through the respective TSV areas (1250_1 and 1250_2). The data transmitted to the serializers (1245_1 to 1245_n) may be transmitted to the ultra-capacitive memory device 1100 through the pad 1248. It may be understood that this internal configuration arrangement does not limit the present disclosure.

Figure 14:
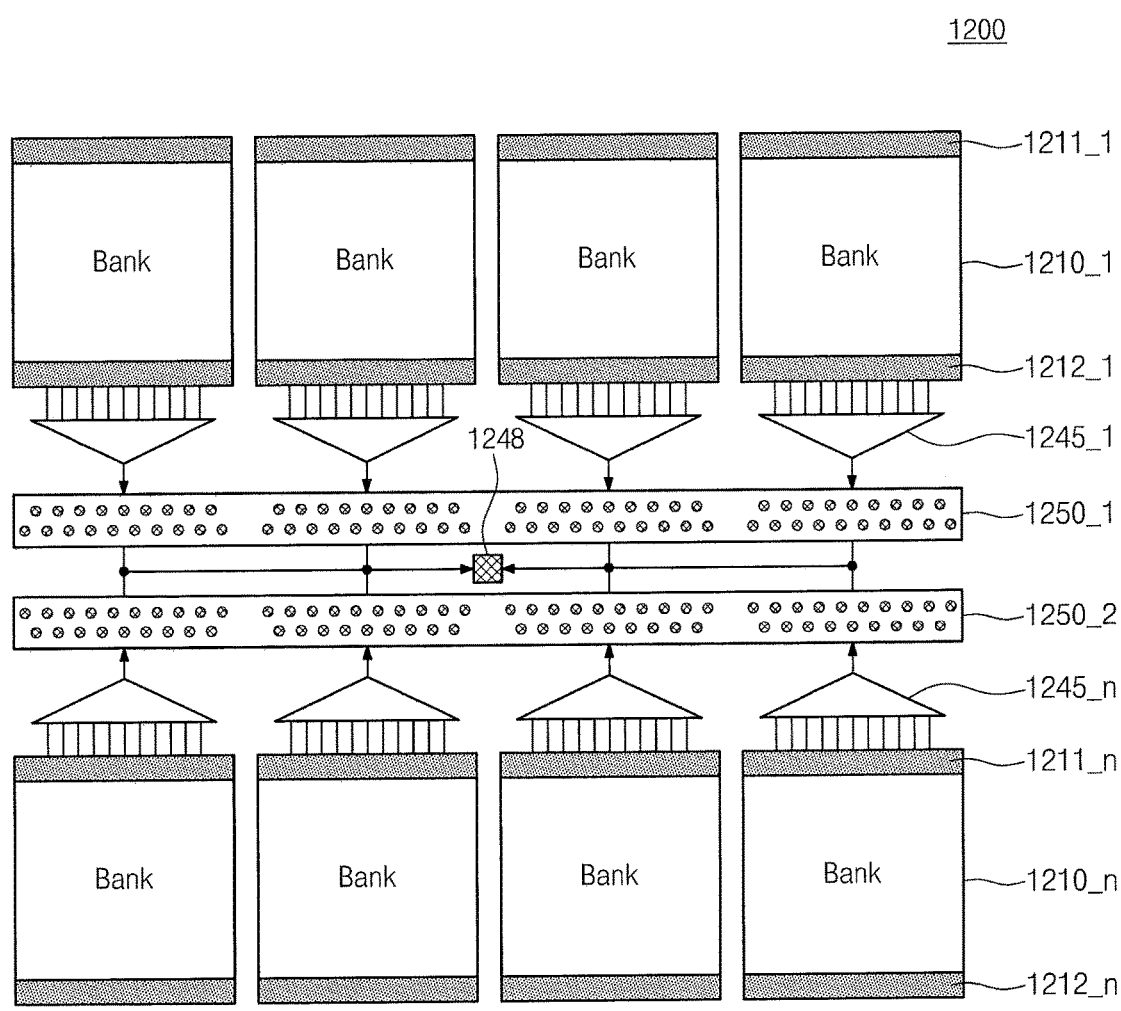

FIG. 14 is a view illustrating a memory device in accordance with example embodiments of the present disclosure. Referring to FIG. 14, the memory device 1200 may include the banks (1210_1 to 1210_n), the serializers (1245_1 to 1245_n), the pad (DQE) 1248, and the through silicon via (TSV) areas (1250_1 and 1250_2). Unlike FIG. 13, in FIG. 14, the order of arrangement of the serializers (1245_1 to 1245_n) and the TSV areas (1250_1 and 1250_2) is changed. It may be understood that this internal configuration arrangement does not limit the present disclosure.

Data stored in the buffer memories (1211_1 to 1211_n, 1212_1 to 1212_n) may be serialized through the serializers (1245_1 to 1245_n). Data stored in the banks (1210_1 to 1210_n) may be serialized through the serializers (1245_1 to 1245_n). The serialized data may be transmitted to the pad 1248 of the lowermost memory device 1200 through the respective TSV areas (1250_1 and 1250_2). Since the banks (1210_1 to 1210_n), the serializers (1245_1 to 1245_n), the pad (DQE) 1248, and the through silicon via (TSV) areas (1250_1 and 1250_2) were described in detail above with reference to FIG. 12 and FIG. 13, a description thereof is omitted here.

Figure 15:
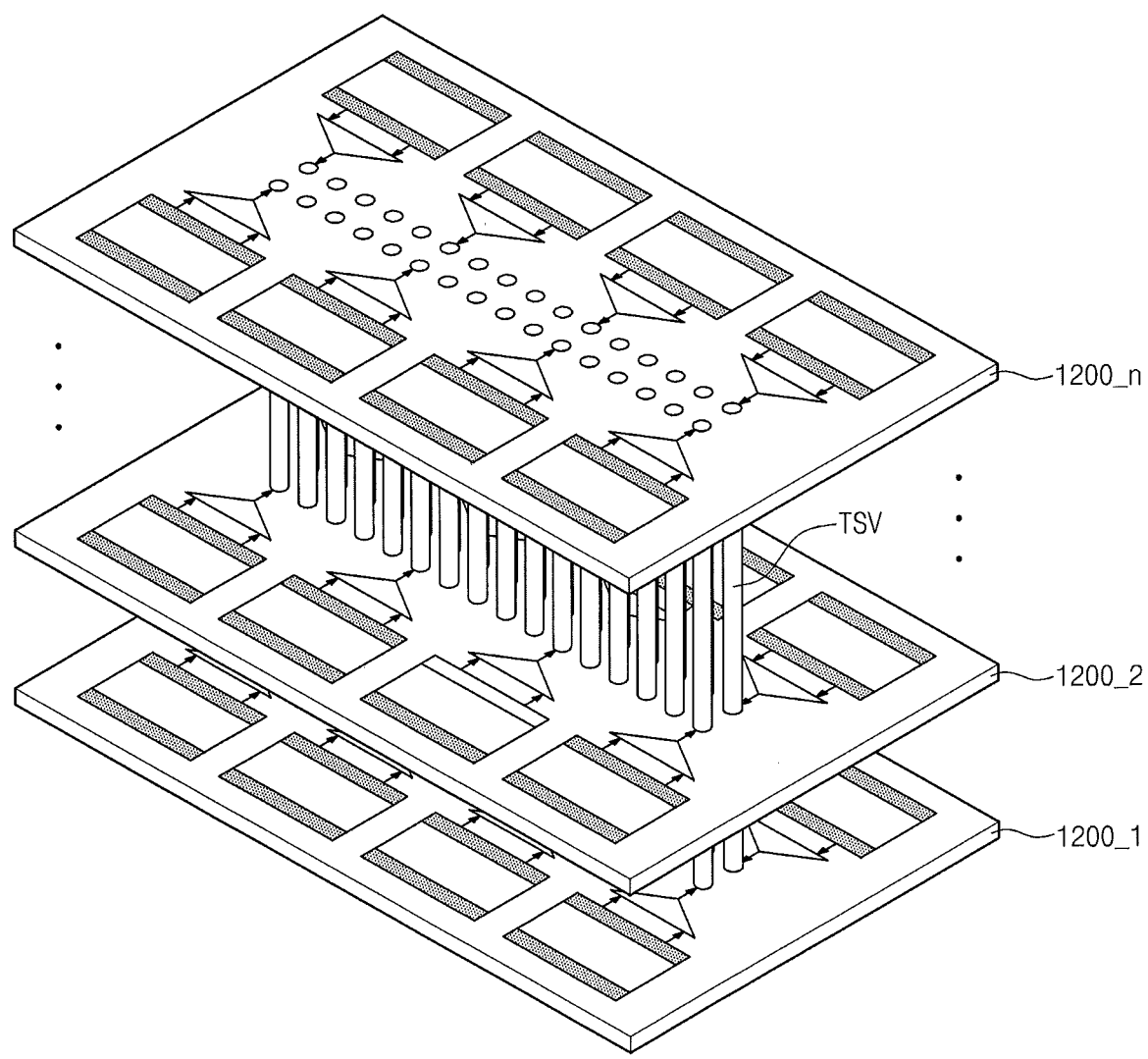
FIG. 15 is a block diagram illustrating a structure in which a memory device in accordance with example embodiments of the present disclosure is stacked.

FIG. 15 is a block diagram illustrating a structure in which a memory device in accordance with example embodiments of the present disclosure is stacked. Referring to FIG. 15, a structure in which a memory device is stacked may include memory devices (1200_1 to 1200_n). Each of the memory devices (1200_1 to 1200_n) may be same as the memory device 1200 illustrated in FIG. 14.

Data stored in the memory devices (1200_1 to 1200_n) may be transmitted to the lowermost memory device 1200_1 through a TSV (through silicon via). The lowermost memory device 1200_1 may be a master chip that interfaces with the outside and the remaining memory devices (1200_2 to 1200_n) may be slave chips.

Although not illustrated, the structure in which a memory device is stacked may further include an additional memory device that performs a function of a master chip on the lowest layer. Data stored in the memory devices (1200_1 to 1200_n) may be transmitted to the lowermost master chip through the TSV. In this case, the memory devices (1200_1 to 1200_n) may be slave chips.

Figure 16:
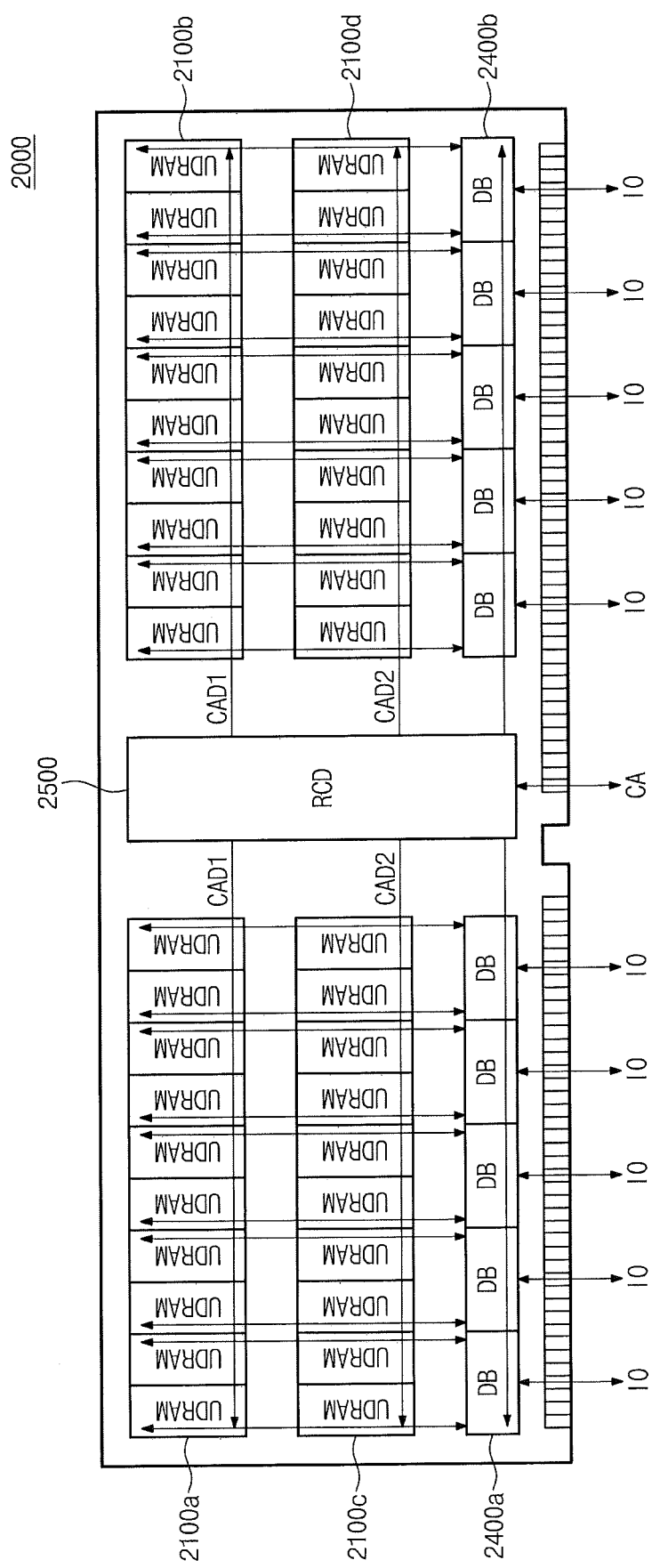
FIG. 16 is a view illustrating a memory module in accordance with example embodiments of the present disclosure.

FIG. 16 is a view illustrating a memory module in accordance with example embodiments of the present disclosure. Referring to FIG. 16, a memory module 2000 may include first, second, third and fourth ultra-capacitive memory devices (UDRAMs) 2100a, 2100b, 2100c and 2100d, first and second data buffers (DBs) 2400a and 2400b, and a register clock driver (RCD) 2500. Since the first, second, third and fourth ultra-capacitive memory devices (UDRAMs) 2100a, 2100b, 2100c and 2100d perform the same function as the first and second ultra-capacitive memory devices (UDRAMs) 1100a and 1100b that is illustrated in FIG. 2, the first and second data buffers (DBs) 2400a and 2400b perform the same function as the first and second data buffers (DBs) 1400a and 1400b that is illustrated in FIG. 2, and the register clock driver (RCD) 2500 performs the same function as the register clock driver (RCD) 1500 that is illustrated in FIG. 2, a description thereof is omitted here.

Since the memory module 2000 includes the ultra-capacitive memory devices 2100, the capacity of the memory module 2000 may be greater than the capacity of the memory module 1000 (illustrated in FIG. 2).

Figure 17:
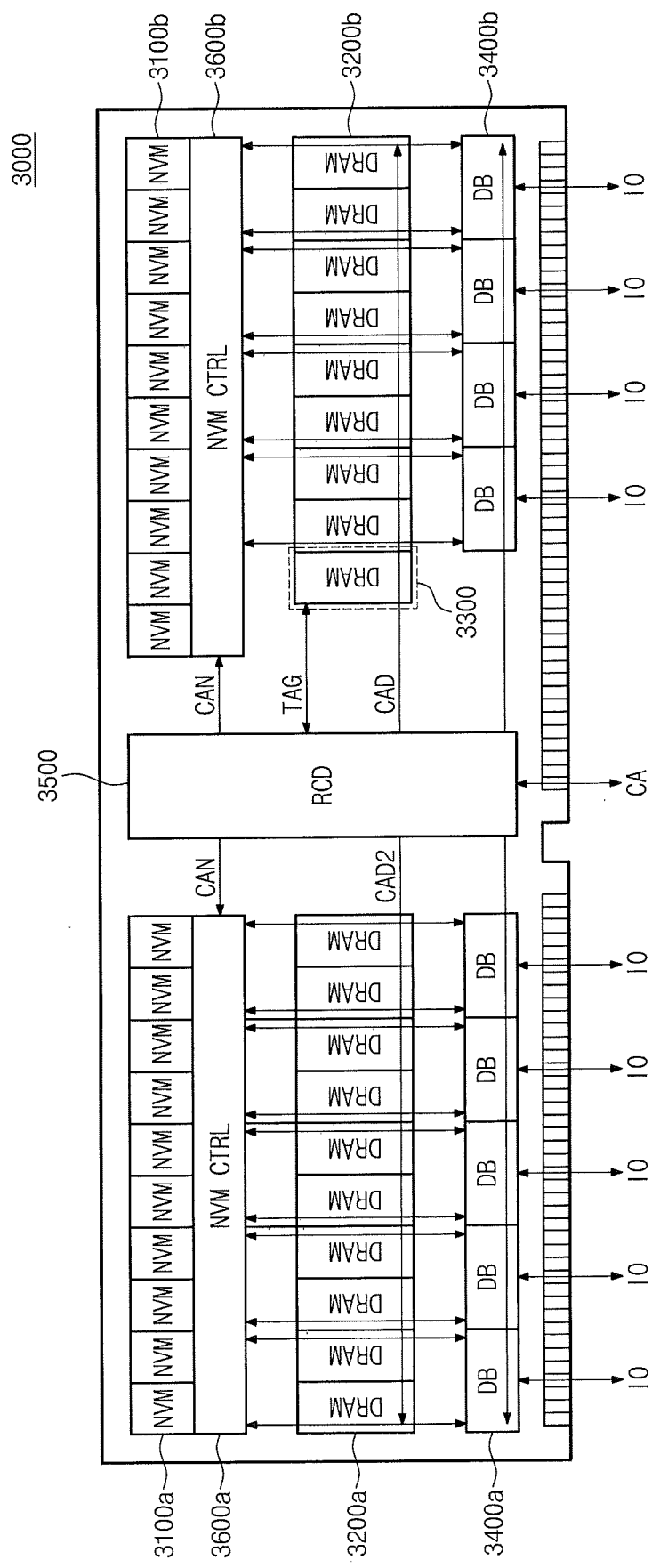
FIG. 17 is a view illustrating a memory module in accordance with example embodiments of the present disclosure.

FIG. 17 is a view illustrating a memory module in accordance with example embodiments of the present disclosure. Referring to FIG. 17, a memory module 3000 may include first and second nonvolatile memory devices (NVMs) 3100a and 3100b, first, second and third memory devices (DRAMs) 3200a, 3200b, and 3300, first and second data buffers (DBs) 3400a and 3400b, a register clock driver (RCD) 3500, and first and second nonvolatile memory device controllers (NVM CTRLs) 3600a and 3600b. Since the first, second and third memory devices (DRAMs) 3200a, 3200b, and 3300, the first and second data buffers (DBs) 3400a and 3400b, and the register clock driver (RCD) 3500 perform the same function as the first, second and third memory devices (DRAMs) 1200a, 1200b, and 1300, the first and second data buffers (DBs) 1400a and 1400b, and the register clock driver (RCD) 1500 that are illustrated in FIG. 2, a description thereof is omitted here.

The nonvolatile memory device 3100 may perform the same function or similar functions as the ultra-capacitive memory device 1100 illustrated in FIG. 2. Unlike the ultra-capacitive memory device 1100, the nonvolatile memory device 3100 may maintain stored data even when power might not be supplied. The nonvolatile memory device 3100 may include NAND cells or NOR cells. The first and second nonvolatile memory device controllers (NVM CTRLs) 3600a and 3600b may control the first and second nonvolatile memory devices (NVMs) 3100a and 3100b respectively.

In accordance with aspects of the present disclosure, various two DIMM per channel (2DPC) memory systems are illustrated in FIGS. 18, 19, 20, 21, 22, 23, 24, and 25 by way of example. The number of memory modules connected to a channel is not limited to the number of memory modules illustrated in FIGS. 18, 19, 20, 21, 22, 23, 24, and 25.

Figure 18:
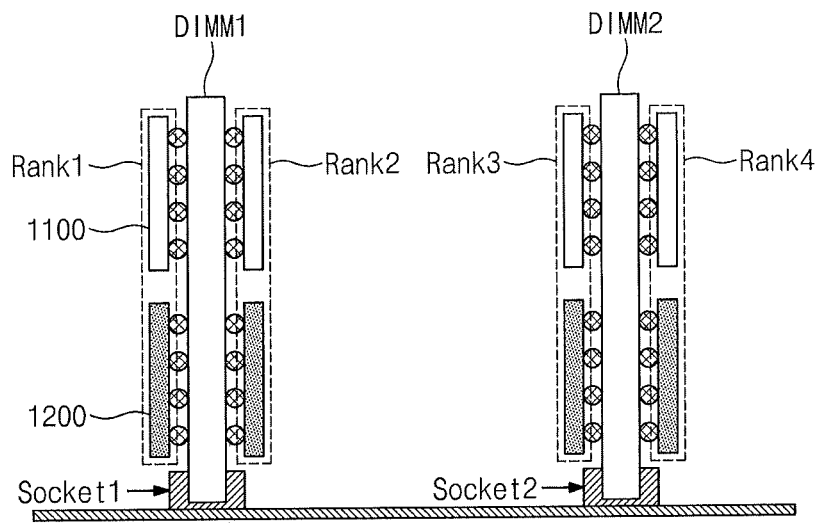
FIGS. 18 through 25 are block diagrams illustrating a 2DPC memory system in accordance with example embodiments of the present disclosure.

FIG. 18 is a block diagram illustrating a 2DPC memory system in accordance with example embodiments of the present disclosure. Referring to FIG. 18, the 2DPC memory system 10 may include memory modules (DIMM1, DIMM2) and first and second sockets (socket1, socket2).

Each of the memory modules (DIMM1, DIMM2) may be the same as the memory module 1000 illustrated in FIG. 2. One side of each of the memory modules (DIMM1, DIMM2) may constitute a rank. The memory module DIMM1 may include first and second ranks. The memory module DIMM2 may include third and fourth ranks. Each rank may include a memory device 1200 and an ultra-capacitive memory device 1100. The memory module DIMM1 may be mounted on the first socket. The memory module DIMM2 may be mounted on the second socket.

Figure 19:
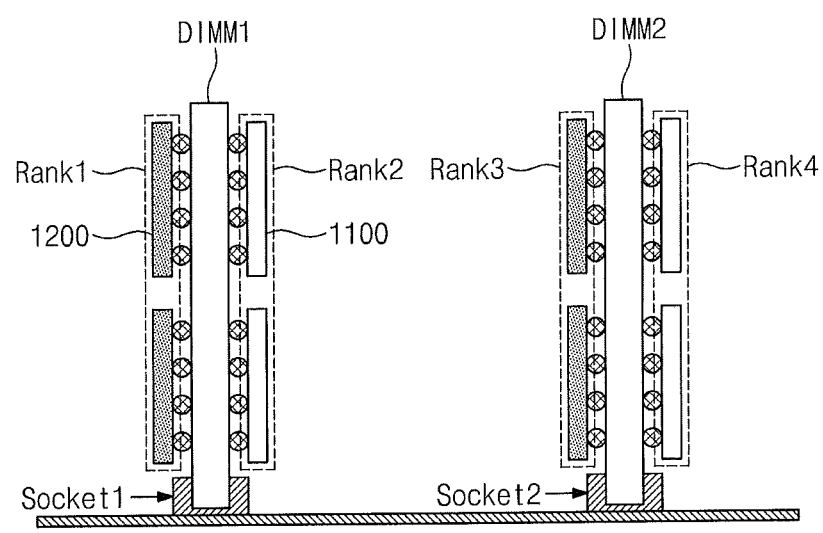

FIG. 19 is a block diagram illustrating a 2DPC memory system in accordance with example embodiments of the present disclosure. Referring to FIG. 19, the 2DPC memory system 20 may include memory modules (DIMM1, DIMM2) and first and second sockets (socket1, socket2).

One side of each of the memory modules (DIMM1, DIMM2) may constitute a rank. The memory module DIMM1 may include first and second ranks. The first rank may include memory devices 1200. The second rank may include ultra-capacitive memory devices 1100. The memory module DIMM2 may include third and fourth ranks. The third rank may include memory devices 1200. The fourth rank may include ultra-capacitive memory devices 1100. The memory module DIMM1 may be mounted on the first socket. The memory module DIMM2 may be mounted on the second socket.

Figure 20:
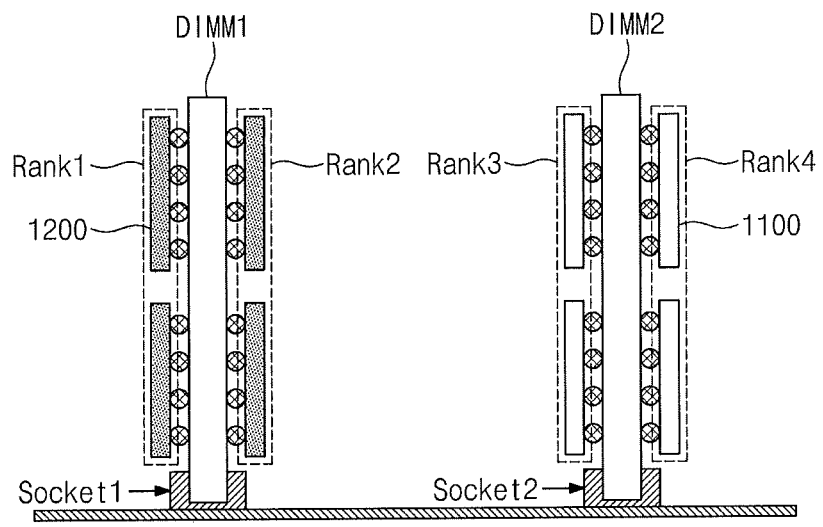

FIG. 20 is a block diagram illustrating a 2DPC memory system in accordance with example embodiments of the present disclosure. Referring to FIG. 20, the 2DPC memory system 30 may include memory modules (DIMM1, DIMM2) and first and second sockets (Socket1, Socket2).

One side of each of the memory modules (DIMM1, DIMM2) may constitute a rank. The memory module DIMM1 may include first and second ranks. Each of the first rank and the second rank may include memory devices 1200. The memory module DIMM2 may include third and fourth ranks. Each of the third rank and the fourth rank may include ultra-capacitive memory devices 1100. The memory module DIMM1 may be mounted on the first socket. The memory module DIMM2 may be mounted on the second socket.

Figure 21:
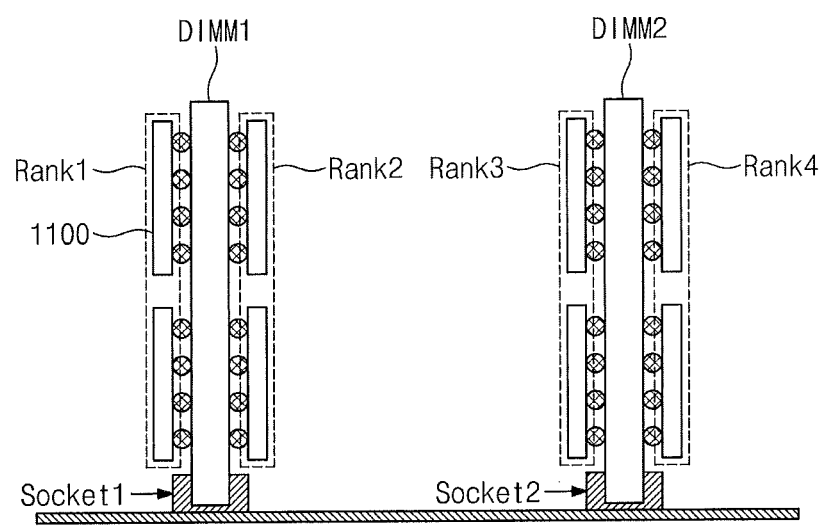

FIG. 21 is a block diagram illustrating a 2DPC memory system in accordance with example embodiments of the present disclosure. Referring to FIG. 21, the 2DPC (DIMM per channel) memory system 40 may include memory modules (DIMM1, DIMM2) and first and second sockets (Socket1, Socket2). Each of the memory modules (DIMM1, DIMM2) may be the same as or similar to the memory module 2000 illustrated in FIG. 16. One side of each of the memory modules (DIMM1, DIMM2) may constitute a rank. The memory module DIMM1 may include first and second ranks. The memory module DIMM2 may include third and fourth ranks. Each rank may include ultra-capacitive memory devices 1100. The memory module DIMM1 may be mounted on the first socket. The memory module DIMM2 may be mounted on the second socket.

TABLE 1

|  | Case 1 (FIG. 18) | Case 2 (FIG. 19) | Case 3 (FIG. 20) | Case 4 (FIG. 21) |
| --- | --- | --- | --- | --- |
| Rank 1 | DRAM + UDRAM | DRAM | DRAM | UDRAM |
| Rank 2 | DRAM + UDRAM | UDRAM | DRAM | UDRAM |
| Rank 3 | DRAM + UDRAM | DRAM | UDRAM | UDRAM |
| Rank 4 | DRAM + UDRAM | UDRAM | UDRAM | UDRAM |

Referring to Table 1, the type of memory device included in the rank included in each of the 2DPC memory systems illustrated in FIGS. 18, 19, 20 and 21 (e.g., cases 1, 2, 3, and 4 respectively) can be checked.

Figure 22:
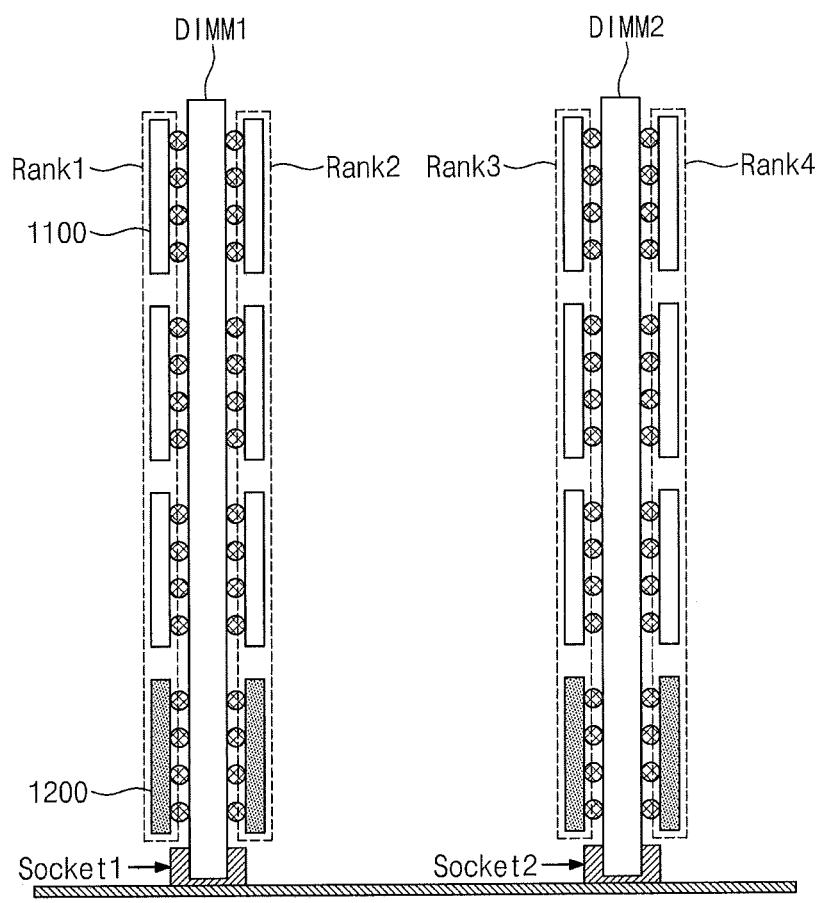

FIG. 22 is a block diagram illustrating a 2DPC memory system in accordance with example embodiments of the present disclosure. Referring to FIG. 22, the 2DPC memory system 50 may include memory modules (DIMM1, DIMM2) and first and second sockets (Socket1, Socket2). To increase the capacity of the 2DPC memory system 50, the 2DPC memory system 50 may include a memory module DIMM higher (e.g., taller or longer when measured from a socket end of the memory module to a distal end of the memory module) than the memory module DIMM illustrated in FIG. 18. For example, the memory module DIMM illustrated in FIG. 18 may include two rows of memory devices, and the memory module DIMM illustrated in FIG. 22 may include four rows of memory devices.

Figure 23:
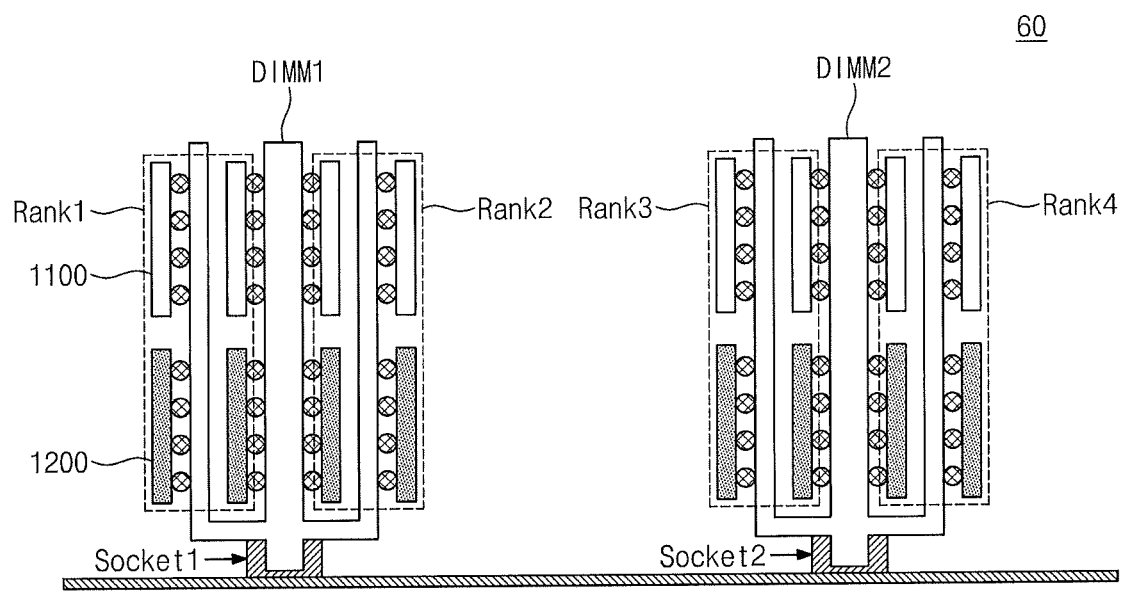

FIG. 23 is a block diagram illustrating a 2DPC memory system in accordance with example embodiments of the present disclosure. Referring to FIG. 23, the 2DPC memory system 60 may include memory modules (DIMM1, DIMM2) and first and second sockets (Socket1, Socket2). To increase the capacity of the 2DPC (DIMM per channel) memory system 60, unlike the memory module DIMM illustrated in FIG. 18, the 2DPC (DIMM per channel) memory system 60 may include a memory module in which a PCB (printed circuit board) is stacked. Referring to FIG. 23, the PCB may be stacked on both sides of each of the memory modules (DIMM1, DIMM2). The memory devices 1200 and the ultra-capacitive memory devices 1100 may be connected to the stacked PCB.

Figure 24:
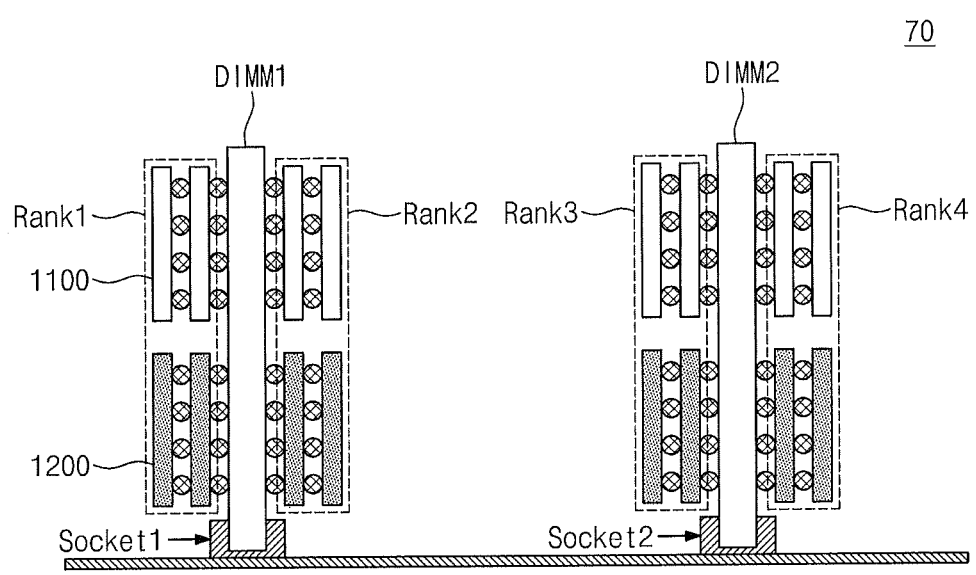

FIG. 24 is a block diagram illustrating a 2DPC memory system in accordance with example embodiments of the present disclosure. Referring to FIG. 24, the 2DPC memory system 70 may include memory modules (DIMM1, DIMM2) and first and second sockets (Socket1, Socket2). Each of the memory modules (DIMM1, DIMM2) may be the same as the memory module 1000 illustrated in FIG. 2. To increase the capacity of the 2DPC memory system 70, each of the memory modules (DIMM1, DIMM2) may stack the memory devices 1200 in a package stacking method. To increase the capacity of the 2DPC memory system 70, each of the memory modules (DIMM1, DIMM2) may stack the ultra-capacitive memory devices 1100 in a package stacking method.

Figure 25:
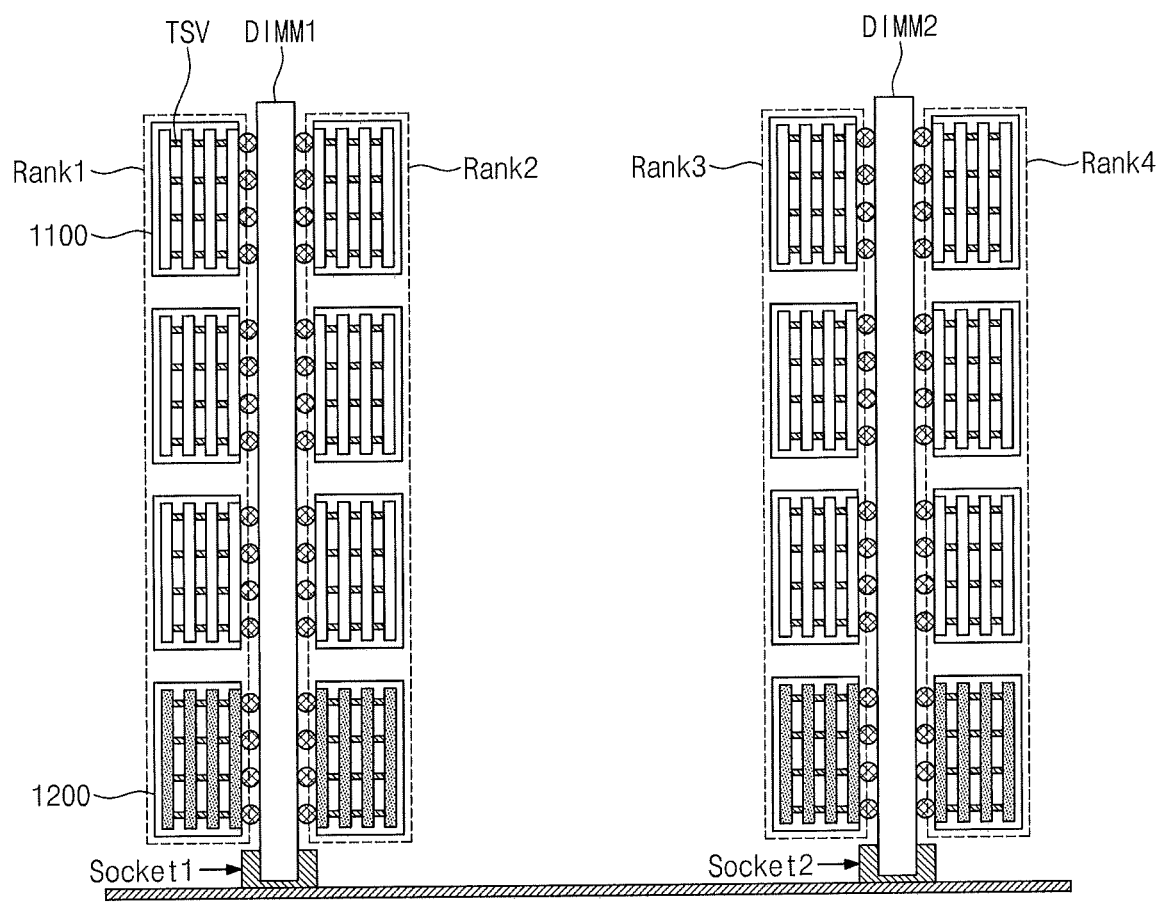

FIG. 25 is a block diagram illustrating a 2DPC memory system in accordance with example embodiments of the present disclosure. Referring to FIG. 25, the 2DPC memory system 80 may include memory modules (DIMM1, DIMM2) and first and second sockets (Socket1, Socket2). Each of the memory modules (DIMM1, DIMM2) may be the same as the memory module 1000 illustrated in FIG. 2. To increase the capacity of the 2DPC memory system 80, each of the memory modules (DIMM1, DIMM2) may stack the memory devices 1200 through through-silicon vias (TSV). To increase the capacity of the 2DPC memory system 80, each of the memory modules (DIMM1, DIMM2) may stack the ultra-capacitive memory devices 1100 through TSV. 2DPC memory systems are illustrated in FIGS. 18, 19, 20, 21, 22, 23, 24, and 25 by way of example. The number of memory modules connected to a channel is not limited to the number of memory modules illustrated in FIGS. 18, 19, 20, 21, 22, 23, 24, and 25.

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:
1. A memory device comprising:
 a bank comprising:
  a first mat comprising first memory cells connected to first word lines;
  first and second bit line sense amplifier circuits disposed at edges of the first mat, configured to sense data stored in the first memory cells through first bit lines, and connected to the first bit lines;
  a second mat comprising second memory cells connected to the first word lines;
  third and fourth bit line sense amplifier circuits disposed at edges of the second mat, configured to sense data stored in the second memory cells through second bit lines, and connected to the second bit lines;

a fifth bit line sense amplifier circuit disposed adjacent to the first bit line sense amplifier circuit, connected to a second word line, and not directly connected to the first bit lines; and a sixth bit line sense amplifier circuit disposed adjacent to the third bit line sense amplifier circuit, connected to the second word line, and not directly connected to the first bit lines; and a row decoder configured to select one of the first word lines according to a first row address and select the second word line according to a second row address, wherein memory cells of the bank are not disposed between the first and fifth bit line sense amplifier circuits and between the third and sixth bit line sense amplifier circuits.

2. The memory device of the claim 1, wherein the bank further comprises:

a seventh bit line sense amplifier circuit disposed adjacent to the fifth bit line sense amplifier circuit, connected to a third word line, and not directly connected to the first bit lines; and an eighth bit line sense amplifier circuit disposed adjacent to the sixth bit line sense amplifier circuit, connected to the third word line, and not directly connected to the second bit lines, wherein the row decoder is further configured to select the third word line according to a third row address, and wherein memory cells of the bank are not disposed between the fifth and seventh bit line sense amplifier circuits and between the sixth and eighth bit line sense amplifier circuits.

3. A memory device comprising:

a bank comprising:

a first mat comprising first memory cells connected to first word lines;

first and second bit line sense amplifier circuits disposed at edges of the first mat, configured to sense data stored in the first memory cells through first bit lines, and connected to the first bit lines;

a second mat comprising second memory cells connected to the first word lines;

third and fourth bit line sense amplifier circuits disposed at edges of the second mat, configured to sense data stored in the second memory cells through second bit lines, and connected to the second bit lines;

a fifth bit line sense amplifier circuit disposed adjacent to the first bit line sense amplifier circuit, connected to a second word line, and not directly connected to the first bit lines; and a sixth bit line sense amplifier circuit disposed adjacent to the third bit line sense amplifier circuit, connected to the second word line, and not directly connected to the first bit lines; and a row decoder configured to select one of the first word lines according to a first row address and select the second word line according to a second row address, wherein the bank further comprises a conjunction disposed between the fifth and sixth bit line sense amplifier circuits, and wherein the conjunction is configured to amplify a signal of the second word line.

4. A memory device comprising:

a bank comprising:

a first mat comprising first memory cells connected to first word lines;

first and second bit line sense amplifier circuits disposed at edges of the first mat, configured to sense data stored in the first memory cells through first bit lines, and connected to the first bit lines;

a second mat comprising second memory cells connected to the first word lines;

third and fourth bit line sense amplifier circuits disposed at edges of the second mat, configured to sense data stored in the second memory cells through second bit lines, and connected to the second bit lines;

a fifth bit line sense amplifier circuit disposed adjacent to the first bit line sense amplifier circuit, connected to a second word line, and not directly connected to the first bit lines; and a sixth bit line sense amplifier circuit disposed adjacent to the third bit line sense amplifier circuit, connected to the second word line, and not directly connected to the first bit lines; and a row decoder configured to select one of the first word lines according to a first row address and select the second word line according to a second row address, wherein the row decoder further comprises:

a first bit line sense amplifier control circuit configured to provide power supply signals to the first and third bit line sense amplifier circuits;

a second bit line sense amplifier control circuit configured to provide power supply signals to the second and fourth bit line sense amplifier circuits; and a third bit line sense amplifier control circuit configured to activate the fifth and sixth bit line sense amplifier circuits through the second word line.

* * * * *